(12) United States Patent
Wang

(10) Patent No.: US 7,784,688 B2
(45) Date of Patent: *Aug. 31, 2010

(54) SYSTEM FOR TRACKING ELEMENTS USING TAGS

(75) Inventor: Chih-Hsin Wang, San Jose, CA (US)

(73) Assignee: RFMarq, Inc., Monte Sereno, CA (US)

( * ) Notice: Subject to any disclaimer, the term of this patent is extended or adjusted under 35 U.S.C. 154(b) by 1004 days.

This patent is subject to a terminal disclaimer.

(21) Appl. No.: 11/091,647

(22) Filed: Mar. 28, 2005

(65) Prior Publication Data

US 2006/0213988 A1    Sep. 28, 2006

(51) Int. Cl.
    *G06K 7/01* (2006.01)
(52) U.S. Cl. ..................... 235/385; 235/380
(58) Field of Classification Search .............. 235/385, 235/380, 382, 492
    See application file for complete search history.

(56) References Cited

U.S. PATENT DOCUMENTS

| | | | |
|---|---|---|---|
| 6,163,299 A | | 12/2000 | Park |
| 6,265,973 B1 * | | 7/2001 | Brammall et al. ........ 340/568.1 |
| 6,373,447 B1 | | 4/2002 | Rostoker et al. |
| 6,734,825 B1 | | 5/2004 | Guo et al. |
| 7,245,213 B1 | | 7/2007 | Esterberg et al. |
| 7,336,270 B2 | | 2/2008 | Sato |
| 2003/0143971 A1 | | 7/2003 | Hongo et al. |
| 2004/0185682 A1 * | | 9/2004 | Foulke et al. ............... 438/800 |
| 2005/0242957 A1 * | | 11/2005 | Lindsay et al. ............ 340/572.7 |
| 2006/0109120 A1 | | 5/2006 | Burr et al. |

* cited by examiner

*Primary Examiner*—Daniel St.Cyr
(74) *Attorney, Agent, or Firm*—Patent Law Group LLP; Carmen C. Cook

(57) ABSTRACT

A management system for tracking elements through steps and stages of a chain employing fixed tags permanently attached to elements that progress through the steps and stages. The elements are tracked by the fixed tags from an initial stage, through multiple work-in-process stages to a final stage of the chain. The fixed tags include radio-frequency (RF) communication units that have wireless communication with RF communicators in one or more of the stages of the supply chain. The wireless communications between the RF tags and the RF communicators operate with a tag communication protocol that defines the operations and sequences for storing information into and retrieval of information from tags. The hierarchy of data storage in RF tags, in RF communicators and otherwise in storage locations in the system is controlled to operate within the memory hierarchy.

45 Claims, 12 Drawing Sheets

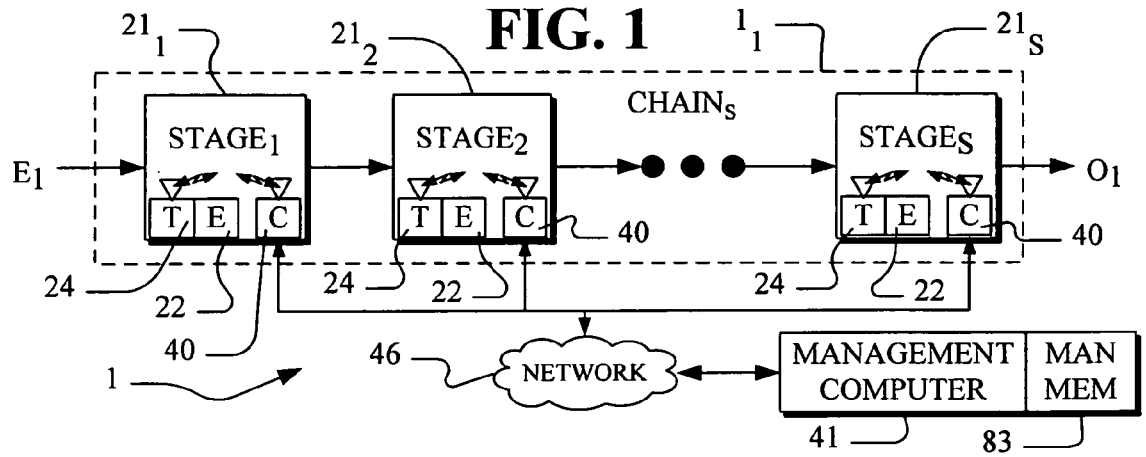
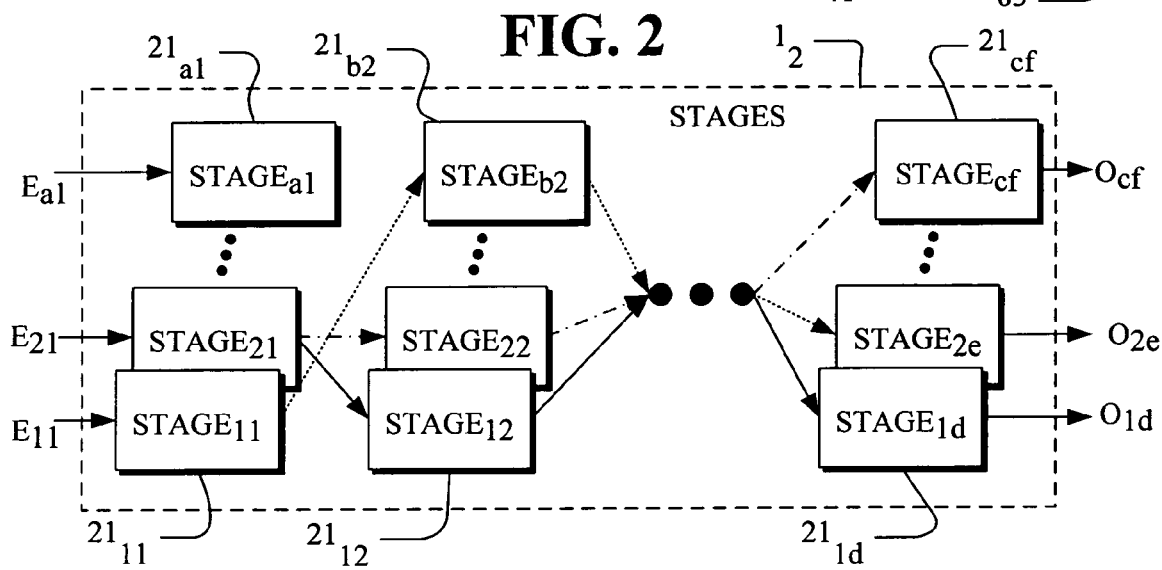
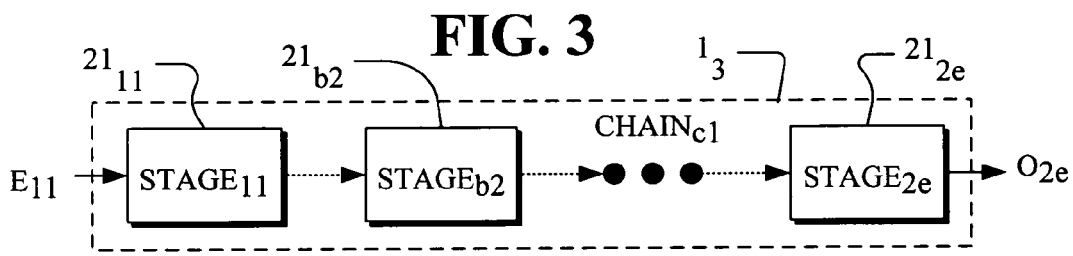
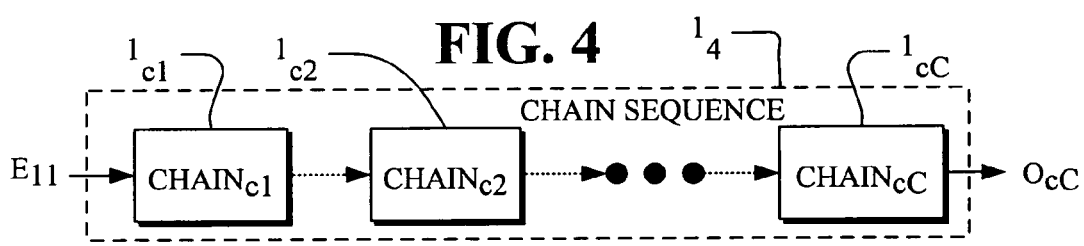

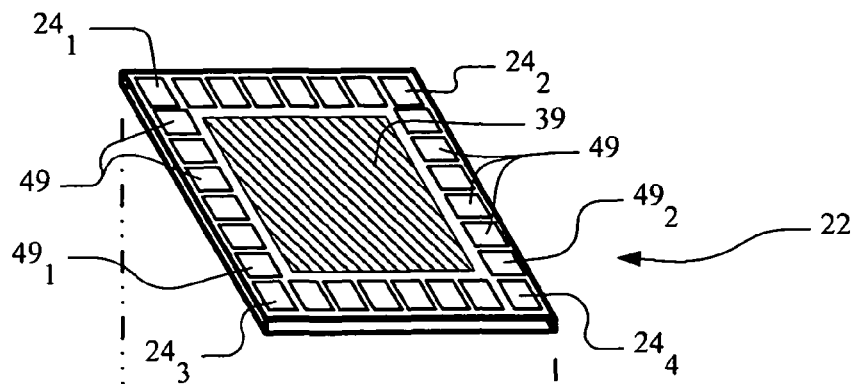
FIG. 19
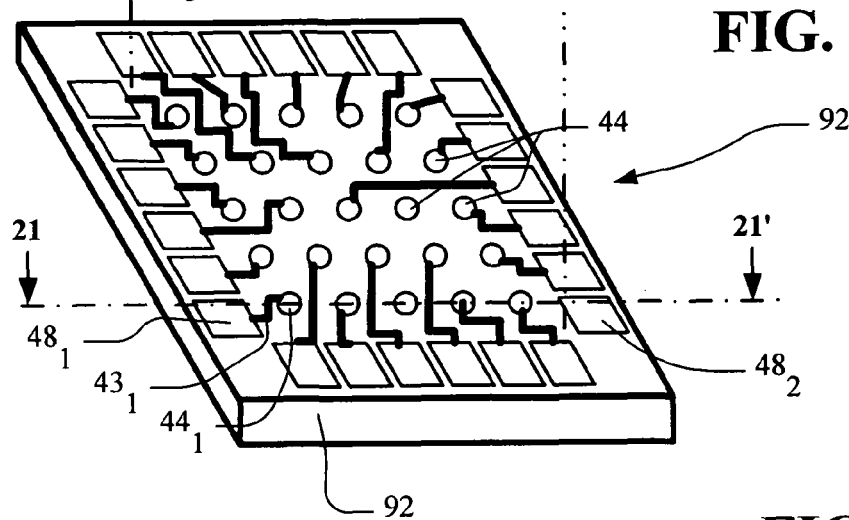
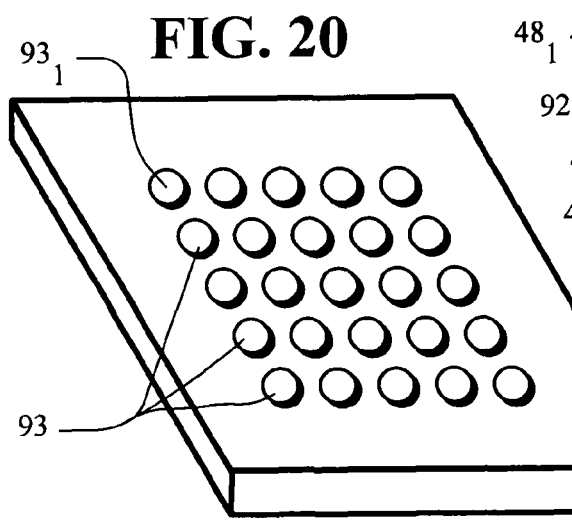
FIG. 20
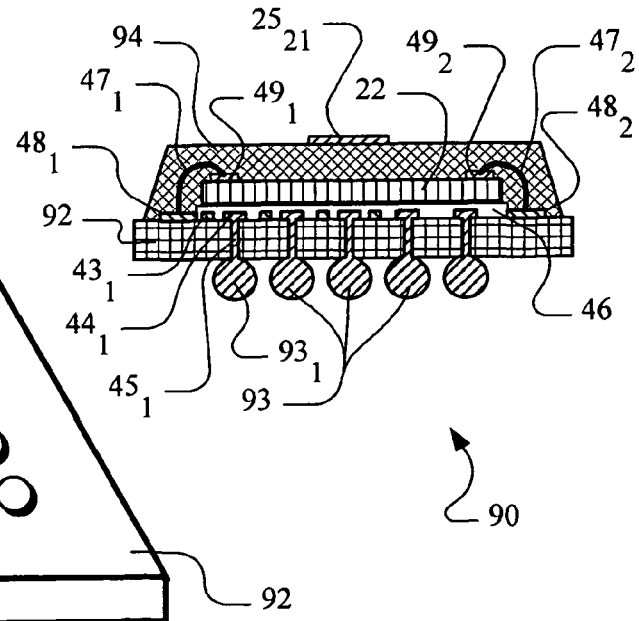
FIG. 21

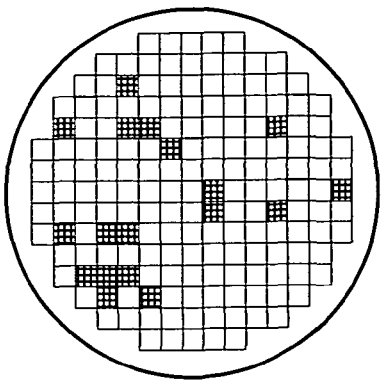
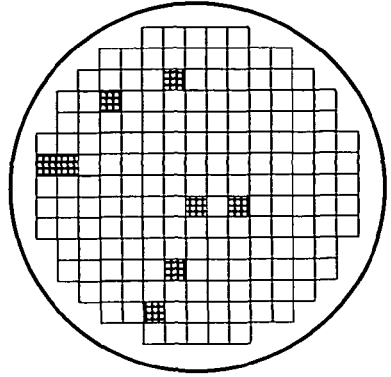
FIG. 24
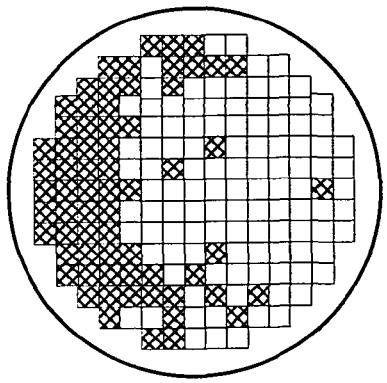
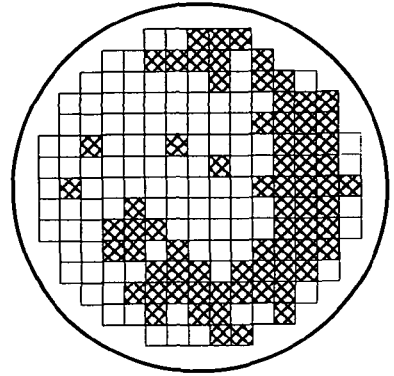
FIG. 25
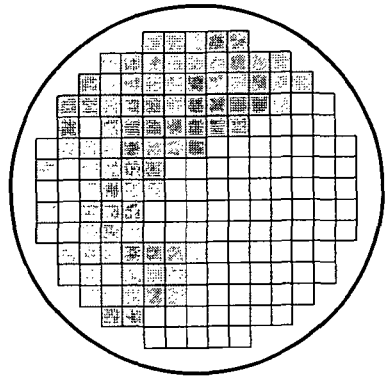
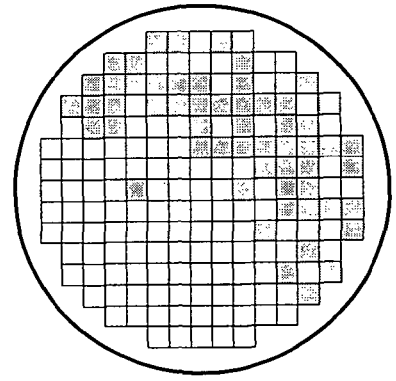
FIG. 26
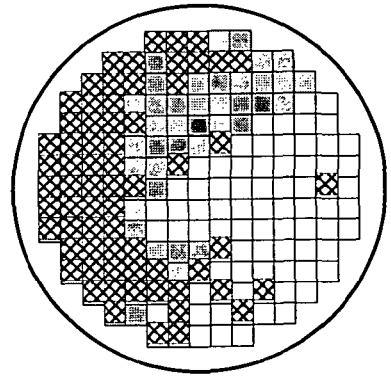
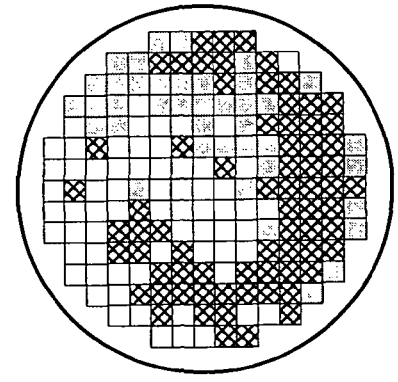
FIG. 27

SYSTEM FOR TRACKING ELEMENTS USING TAGS

TECHNICAL FIELD

The present invention relates to management systems, and relates more specifically to methods and apparatus for tracking elements through processing steps and stages at an elemental level.

BACKGROUND OF THE INVENTION

Management systems are well known for managing supply chains. Such management systems track elements from an initial stage, through intermediate stages (work-in-process stages), to a final stage. In manufacturing supply chain processes, the initial stage can be raw material, work-in-process can be assembly and the final stage can be finished goods. Warehouses to store raw material, semi-finished goods and/or finally finished goods are required at each stage of the process. Typically one or more suppliers provide manufacturing, warehouse and/or other services for processing and storing materials, semi-finished goods or other elements in a manufacturing processing chain from the initial stage, through the work-in-process stages to the final stage.

In a semiconductor industry example, the processing chain commences with wafers as initial elements and continues the processing over multiple work-in-process stages where the elements become dies that are assembled, tested and packaged to form devices at the final stage. In this example, the finished goods are tested chips that are packaged in single or multi-chip packages as the semiconductor devices. There can be one or more outside suppliers involved in this processing chain ("Out-sourcing") or only internal departments providing all functions ("In-sourcing") or a mixed use of the In-sourcing and the Out-sourcing. The completed semiconductor devices are ready to function as components in electronic equipment such as computers, cell phones or consumer electronic products. The semiconductor devices will enter another down-stream manufacturing chain where the components (initial stage) are sold to one or more buyers such as distributors, electronic equipment manufacturing service (EMS) companies or directly to the electronic equipment companies for assembly (work-in-process stage) and the final equipment will be produced (final stage). Frequently though, after an initial processing chain, one or more additional processing chains are required. For the same example, in the manufacturing of electronic equipment, semiconductor devices from a first processing chain are further processed in an electronic circuit board chain for forming circuit boards. Still again, after a second chain, third and additional processing chains may occur. For example, one or more electronic circuit boards are processed to form final electronic equipment such as a cell phone, computer or television.

Complex supply chain environments, such as in the semiconductor industry, present a number of difficulties. One difficulty results when multiple suppliers and buyers are participants in the processing chain (s), and each participant, whether buyer or supplier, tends to use different parameters, terminology, terms, conditions, formats, protocols and other information unique to the particular participant. These differences among participants result in information accuracy and exchange problems. Other problems occur when data is manually entered or otherwise processed by people. Human operations frequently cause data errors. Reports based upon human operations invariably have errors. Also, when information is stored and retrieved using remote data bases, the retrieval of data is often troublesome, inaccurate or not timely.

The information accuracy and exchange problems are aggravated when materials, goods, services and other elements from one stage are processed at downstream stages. Both upstream and downstream stages may be In-sourcing stages at one company or Out-sourcing stages existing with relationships among multiple buyers and suppliers. Regardless of whether In-sourcing or Out-sourcing occurs; visibility across the supply chain is required for efficient and economical supply chain management. For visibility to occur, the interrelationship among upstream and down stream stages requires an exchange of accurate, consistent and timely information.

The problems associated with the proliferation of different terminology, specifications, information exchange formats and protocols by participants in supply chains are well known. While a dominating buyer or a dominating supplier can demand conformance for its own business, the semiconductor manufacturing industry as a whole remains widely fragmented without much progress toward standardization. Although semiconductor industry efforts at standardization have occurred, for example Rosettanet, fragmentation is likely to exist for many years to come. Fragmentation exists, of course, in many other industries.

Management of the supply chain at the highest level relies upon, among other information, identity information for elements in all the stages of the supply chain. This identity information is used by companies including buyers and suppliers participating in the supply chain. In semiconductor manufacturing, the identity information has, in general, been limited to a wafer identifier (Wafer ID) for an individual wafer and a lot identifier (Lot ID) for an individual lot (a plurality of wafers). The identity information during work-in-process stages, as a result of manufacturing steps, often gets lost once a lot is split into sub-lots, after a wafer is cut into dies and/or after dies are packaged into semiconductor devices. When multiple dies are packaged together in a multi-chip packaged device, the identity information for the individual dies is typically lost.

Efforts have been made to track lots (and the related dies and devices) at each manufacturing step through the work-in-process stages. In the semiconductor industry, for example, wafers have been tracked with a Wafer ID using a static optical barcode. At the finished-goods stage, packaged devices are usually marked with new product identity information (typically loosing the Wafer bar code, any Lot ID, any Wafer ID and any individual device identity) before transfer to a subsequent processing chain or shipment to a buyer. The tracking of information is particularly difficult when tracking involves hierarchical elements.

Hierarchical elements are elements that have a hierarchical relationship to other elements in multistage and multistep processing. When a first element (for example, a semiconductor wafer) at one stage is divided into plural second elements in another stage (for example, semiconductor dies), the first element (wafer) is defined to be at a higher level in the hierarchy and the second elements (semiconductor dies) are defined to be at a lower level in the hierarchy. When a single element or plural second elements (semiconductor dies) are packaged to form a third element (a packaged part), the second elements (dies) are defined to be at a higher level in the hierarchy and the third element (package parts) is defined to be at a lower level in the hierarchy. Likewise, when plural third elements (semiconductor package parts) are combined to form a fourth element (a board with packaged dies), the third elements (package parts) are defined to be at a (higher)

level in the hierarchy and the fourth element (board) is defined to be at a (lower) level in the hierarchy. All of the first, second, third and fourth elements have a hierarchical relationship to each other because the quality and other parameters affecting and characterizing the elements are correlated because the elements are subject to common processing, treatment or aggregation at different steps or stages.

Such correlated elements in this specification are defined to be hierarchical elements. For quality control, efficiency and other reasons, it is important to keep track of the hierarchy of elements undergoing multistage and multistep processing. Hierarchical tags are tags associated with hierarchical elements. In the semiconductor example, wafer tags are defined to be at a higher level than die tags and similarly die tags are at a higher level than package part tags (tags associated with packaged parts). The hierarchical history of a particular element is the history of the particular element and the history of the hierarchical elements with which the particular element is associated.

While tracking systems can attempt to track elements at an elemental level from the initial stage to the final stage of a chain, in actual practice, missing, incompatible and inaccurate information frequently results particularly when hierarchical elements are involved.

In systems in which a Wafer ID barcode is provided on each wafer, the Wafer ID is read with an optical reader at a wafer station. To read the Wafer ID, the optical reader causes an incident laser beam to impinge on the bar code and the incident beam causes a reflected beam which includes the bar code data. The incident laser beam, through human or machine control, must be aligned to accurately impinge on the Wafer barcode to cause a reflected beam to include the barcode information. The data coded in the barcode is processed by an optical reader to extract the barcode data. Such optical readers are directional and require careful alignment of the incident and reflected light beams. The alignment is frequently troublesome and misalignment results in unidentified wafers or other errors. Since the reflected light beam is typically weak, the distance between the barcode and the reader must be small to permit the barcode to be read. The distance generally required is in the range of from about 0.1 cm to about 50 cm. Barcode systems are adversely affected by dirt, dampness and other environmental conditions that are difficult to control and hence the identification accuracy is vulnerable to unfavorable environmental conditions.

Another problem associated with barcode identification systems is that only a Wafer ID is available from the barcode and any further detailed information is not available. When further information is wanted, the information is stored in a remote data base of the management system. To retrieve the local information of an element at any stage, the Wafer ID is provided to the data management system and a data base inquiry is made to obtain the local information. The local information is not attached physically to the element in the work-in-process stages and hence may not be readily accessible, may not be properly stored and may have been corrupted.

Where ID's are present at some stages of some chains, often the ID's are lost for subsequent chains so that no consistent linking of information is present for subsequent chains such as further processing and distribution chains.

In light of the foregoing problems, there is a need for improved systems for tracking elements from step to step, from stage to stage and from chain to chain and for accurately tracking elements commencing with an element start level using ID's that do not get lost.

SUMMARY OF THE INVENTION

The present invention is a management system for tracking elements through stages of a chain employing fixed tags, that is, tags that are permanently attached internally or externally to elements that progress through the stages. The elements are tracked by the fixed tags from an initial stage, through multiple work-in-process stages to a final stage of the chain. The bound tags include radio-frequency (RF) communication units that have wireless communication with RF communicators in one or more of the stages of the supply chain. The wireless communications between the RF tags and the RF communicators operate with a tag communication protocol that defines the operations and sequences for storing information into and retrieval of information from tags. The hierarchy of data storage in RF tags, in RF communicators and otherwise in storage locations in the system is controlled to operate within the memory hierarchy.

In embodiments of the present invention, the RF tags are physically bound to elements processed through the chain. In one semiconductor embodiment, RF tags are provided for semiconductor dies, one or more tags for each die, and are manufactured and imbedded as electronic circuits within and using the native processing technology of the dies and wafers. The native processing technology is the same technology used to manufacture the primary functional circuits on the dies. In another embodiment, the RF die tags are manufactured with an external process technology and the tags are then attached to the dies using an add-on process. In either of the embodiments, the RF die tags are bound to the dies and remain with the dies through the processing chain stages.

In one semiconductor embodiment, the bound tags function to store information for dies, wafers, lots (a plurality of wafers) and batches (a plurality of lots). In a typical embodiment, each die for each wafer in each lot and in each batch includes an RF die tag. In one embodiment, the RF die tag includes storage locations in memory for storing information in the RF die tag that includes Die Data, Wafer Data, Lot Data and Batch Data whereby the full hierarchy, or any portion thereof, of information through the supply chain, as pertaining to a particular die, is stored on such particular die.

In another semiconductor embodiment, each wafer includes an RF wafer tag. The RF wafer tag includes storage locations in memory for storing information in the RF wafer tag that includes Die Data for dies on the wafer, Wafer Data for the wafer, Lot Data and Batch Data whereby the full hierarchy, or any portion thereof, of information through the supply chain, as pertaining to the wafer and associated dies, is stored on each wafer and/or on each die.

In other semiconductor embodiments, still additional RF tags are bound to dies or wafers or otherwise are bound for lots or batches or for any other physical or logical organization of elements in a supply chain.

In typical embodiments, each RF tag includes an RF coupling element (antenna), an RF interface for transforming signals between RF frequencies and data processing frequencies, memory for storing data, a logic controller for controlling the read/write of data and other operations of the tag and a power supply for powering the tag. Typically, the power supply powers the tag from received energy from incoming RF signals from an RF communicator.

The tag communications protocol for controlling communications between the RF tags on processed elements and the RF communicators at supply stages is effective to efficiently utilize the bandwidth available for wireless communications. For bandwidth requirements when the number of dies per wafer is large, the tag communications protocol operates to distribute the communications between RF communicators and RF tags over time windows. In one embodiment, the communications protocol relies on the location of dies on a wafer and sequentially accesses the dies according to their location at different times.

The foregoing and other objects, features and advantages of the invention will be apparent from the following detailed description in conjunction with the drawings.

BRIEF DESCRIPTION OF THE DRAWINGS

FIG. 1 depicts a chain of stages for processing elements using RF tags bound to elements to communicate with communicators in the stages.

FIG. 2 depicts a group of stages of the FIG. 1 type where input elements sequence through particular ones of the stages using different paths.

FIG. 3 depicts a chain which represents one particular sequence of stages in the FIG. 2 group of stages for processing elements.

FIG. 4 depicts a sequence of chains including the FIG. 3 chain as the first chain in the sequence.

FIG. 19 depicts a schematic, isometric, exploded, top view of a chip carrier for a Ball Grid Array (BGA) package under a die of the FIG. 14 type.

FIG. 20 depicts a schematic, isometric bottom view of the chip carrier of FIG. 19.

FIG. 21 depicts a schematic sectional view of a Ball Grid Array (BGA) package including the chip carrier and die along section line 21-21' of FIG. 19 with the chip carrier and die assembled and with packaging material added.

FIG. 24 depicts a visual display of a read out of tag data indicating good (white) and bad (shaded) die on a wafer where the bad die appear to be randomly located.

FIG. 25 depicts a visual display of a read out of tag data indicating good (white) and bad (shaded) dies on a wafer where the bad dies are as a result of an ISB test.

FIG. 26 depicts a visual display of a read out of tag data indicating good (white) and bad (shaded) dies on a wafer where the bad dies are as a result of a G. F. test.

FIG. 27 depicts a visual display of a read out of tag data indicating good (white) and bad (shaded) dies on a wafer where the bad dies are as a result of both the ISB and G. F. tests.

DETAILED DESCRIPTION

Figure 5:
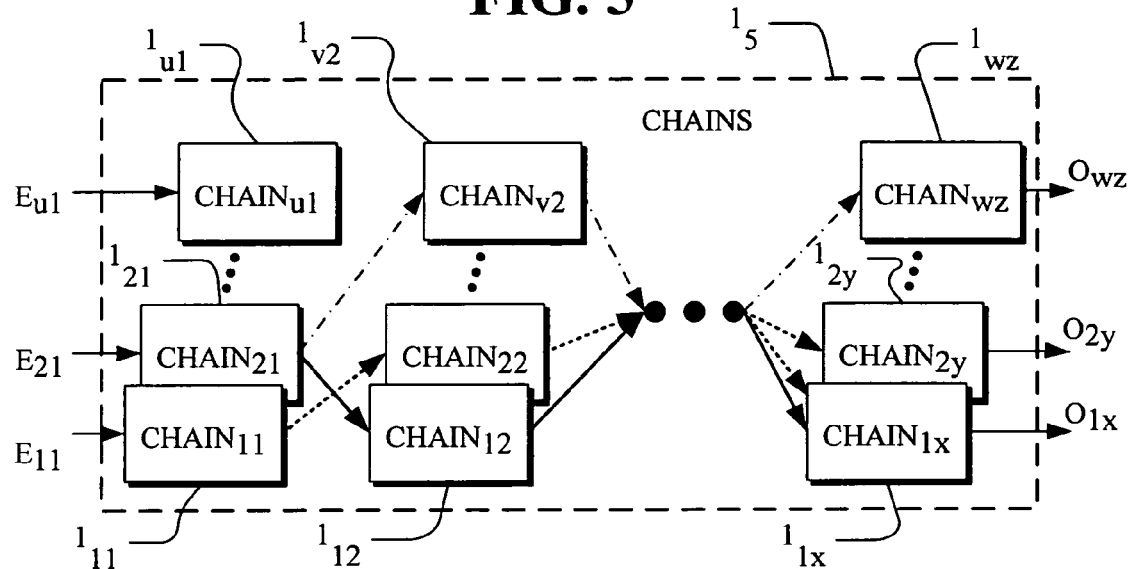
FIG. 5 depicts a group of chains of the FIG. 4 type where input elements sequence through particular ones of the chains using different paths.

In FIG. 1, a management system 1 includes a chain $1_1$ that operates to process elements 22 through multiple stages 21 including stages $21_1, 21_2, \ldots, 21_S$. The initial elements $E_1$ are input to initial stage $21_1$ and are processed as elements 22 through intermediate stages until output $O_1$ at the final stage $21_S$. Each of the stages 21 has RF tags 24 bound to the elements 22. Each stage includes an electronic communicator 40 for electronic communication with the tags 24 bound to the processed elements 22. In a preferred embodiment the communication between tags and communicators is wireless RF communication. The communicators 40 each connect through a network 46 to a management computer 41 where the network connections may be of any type such as local area networks (LANs), wide area networks (WANs), the internet and any combination of networks of different types. In one example, chain $1_1$ is a semiconductor manufacturing chain where the input elements $E_1$ are semiconductor wafers, where the intermediate stages include Wafer Fab, Wafer Sort, Assembly and Final Test and where the output elements $O_1$ are packaged semiconductor devices. While semiconductor manufacturing is one example of a processing chain, many other industries have analogous processing chains.

In FIG. 2, a complex array $1_2$ of a group of processing stages 21 is provided for processing elements. While not shown in FIG. 2, each of the stages 21 processes elements with bound tags as described in connection with FIG. 1 and each of the stages 21 includes communicators for electronic communication with the tags as described in connection with FIG. 1. In FIG. 2, the stages are organized by rows $1, 2, \ldots, a$; by rows $1, 2, \ldots, b; \ldots$, and so forth by rows $1, 2, \ldots, c$; and the stages are also organized by columns $1, 2, \ldots, d$; by columns $1, 2, \ldots, e$; and so forth by columns $1, 2, \ldots, f$. The elements $E_{11}, E_{21}, \ldots, E_{a1}$ are input to the input stages $21_{11}, 21_{21}, \ldots, 21_{a1}$, respectively. The elements from the input stages pass to any of the appropriate subsequent stages $21_{12}, 21_{22}, \ldots, 21_{b2}$ and so forth through any additional intermediate stages until the processed elements pass to the output stages $21_{1d}$, $21_{2e}$, ..., $21_{cf}$ to form the outputs $O_{1d}$, $O_{2e}$, ..., $O_{cf}$. The array $1_2$ of grouped stages, in one example in the semiconductor industry, receives elements $E_{11}$, $E_{21}$, ..., $E_{a1}$ as wafers from a Wafer fab stage where stages $21_{11}$, $21_{21}$, ..., $21_{a1}$ are Wafer Sort stages, where stages $21_{12}$, $21_{22}$, ..., $21_{b2}$ are Assembly stages, where stages $21_{1d}$, $21_{2e}$, ..., $21_{cf}$ are Final Test stages.

In FIG. 3, a chain $1_3$ represents one particular sequence of stages in the FIG. 2 group of stages for processing elements. In a semiconductor example, elements $E_{11}$ are wafers initially input from a wafer fab stage to a Wafer Sort stage $21_{11}$. After Wafer Sort stage $21_{11}$, elements are input to Assembly stage $21_{b2}$ and thereafter elements are input to Final Test stage $21_{2e}$.

In FIG. 4, a chain of chains $1_4$ includes as the first chain, the $1_{c1}$ chain $1_3$ of FIG. 3. The first chain, $1_{c1}$, in FIG. 4 connects to the sequence of chains $1_{c2}$, ..., $1_{cC}$. In one semiconductor example, the chain $1_{c1}$ represents the processing of wafers from wafer fab to packaged semiconductor devices, the chain $1_{c2}$ represents the processing for manufacturing semiconductor boards and chain $1_{cC}$ represents the processing using semiconductor boards to make a completed unit, such as a cell phone or a computer.

In FIG. 5, a group $1_5$ of chains is formed of a complex array of chains $1_5$. The chain of chains $1_4$ of FIG. 4 is one subset of chains in the array of FIG. 5 for sequencing elements through a single sequential path. In FIG. 5, the chains are organized as rows 1, 2, ..., u; rows 1, 2, ..., v; ...; and so forth to rows 1, 2, ..., w; and are organized into columns 1, 2, ..., x; columns 1, 2, ..., y; and so forth to columns 1, 2, ..., z. The elements $E_{11}$, $E_{21}$, ..., $E_{u1}$ are input to the chains $1_{11}$, $1_{21}$, ..., $21_{u1}$, respectively. Any element from an input chain may pass to any of the appropriate subsequent chains $1_{12}$, $1_{22}$, ..., $1_{v2}$ and so forth until, after the subsequent chains $1_{12}$, $1_{22}$, ..., $1_{v2}$, and any additional intermediate chains, the processed elements pass to the output chains $1_{1x}$, $1_{2y}$, ..., $1_{cf}$ to form the outputs $O_{1x}$, $O_{2y}$, ..., $O_{wz}$. An semiconductor industry example of the processing through selected ones of the grouped chains $1_5$, has the elements $E_{11}$, $E_{21}$, ..., $E_{u1}$ as wafers from a wafer Fab where the chains $1_{11}$, $1_{21}$, ..., $21_{u1}$ process the wafers from input to packaged semiconductor devices. The chains $1_{12}$, $1_{22}$, ..., $1_{v2}$ represent, in one example, the processing for manufacturing semiconductor boards and the chains $1_{1x}$, $1_{2y}$, ..., $1_{wz}$ represent, for example, the processing using semiconductor boards to make completed units, such as cell phones or computers, as the output elements $O_{1x}$, $O_{2y}$, ..., $O_{wz}$. The completed units represented by elements $O_{1x}$, $O_{2y}$, ..., $O_{wz}$ in turn are distributed and sold through distribution chains that are again an example of the multistage chains of FIG. 1 through FIG. 6.

Figure 6:
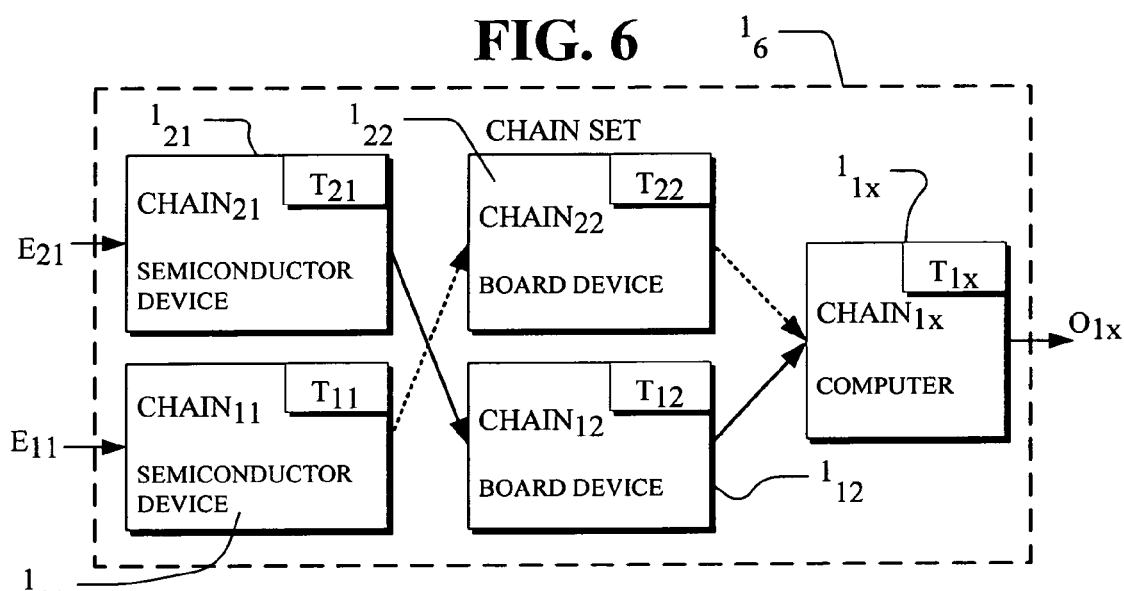
FIG. 6 depicts a particular set of chains from the FIG. 5 group of chains where the particular set of chains processes multiple elements to form semiconductor devices, to form board devices and to form a system element such as a computer.

In FIG. 6, a set of chains $1_6$, from the grouped chains of FIG. 5, process multiple input elements $E_{11}$ and $E_{21}$ to form first intermediate elements, such as packaged semiconductor devices, in two chains $1_{11}$ and $1_{21}$. The processed first intermediate elements are further processed in two chains $1_{12}$ and $1_{22}$ to form second intermediate elements such as circuit boards. Finally, the second intermediate elements are combined in a chain $1_{1x}$ to form a final product such as a computer at output $O_{1x}$.

Figure 7:
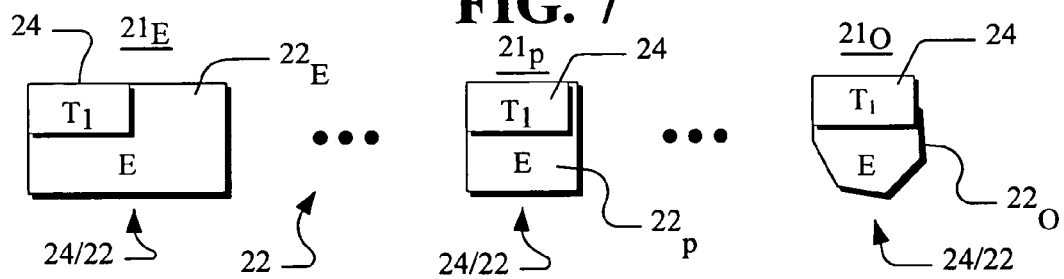
FIG. 7 is a schematic representation of an element with a bound tag that is processed from an initial stage to a final stage with the bound tag present from start to finish.

In FIG. 7, a single tag/element pair 24/22, including input element $22_E$ and bound tag 24, is processed through multiple stages including an initial stage for element $22_E$, an intermediate stage for element $22p$ representing one of a series of intermediate stages, and a final stage $22_O$. The tag 24 (TAG$_1$) remains bound to the element $22_E$ (E) during the time that element $22_E$ is processed from initial stage $21_E$, through intermediate stages including stage $21_P$, to final stage $21_O$. As indicated in connection with FIG. 1, RF communication with each tag 24 is one preferred method of communication. As the element 22 under goes processing changes from its initial stage to its final processed stage, the tag $T_1$ is used for recording and identifying information about the element 22 and its transitions $22_E$, ..., $22p$, ..., $22_o$ as the processing transpires.

Figure 8:
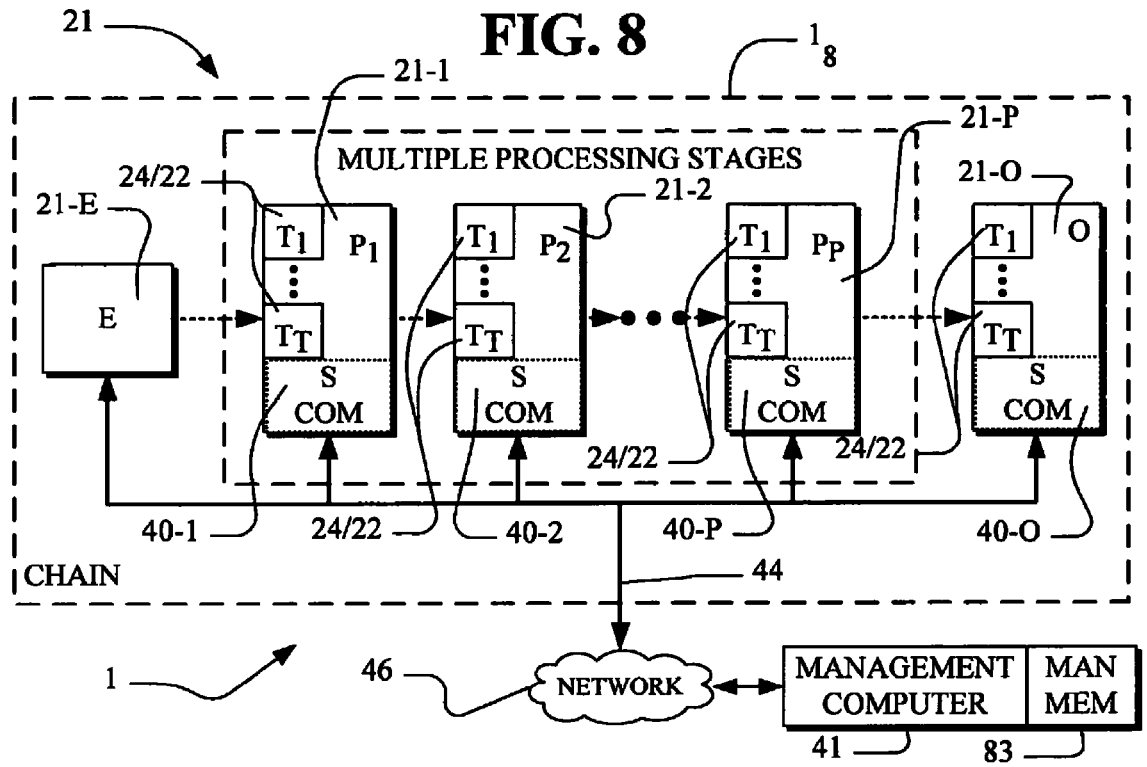
FIG. 8 depicts a multistage chain under control of a management computer.

In FIG. 8, a management system 1 has RF tags 24 bound to elements 22 where the tags and elements 24/22 are processed through multiple stages 21 of a chain $1_8$. The tagged elements 24/22 in each stage in FIG. 8 include the RF tags $T_1$, $T_2$, ..., $T_T$. The multiple processing stages 21 include the stages 21-1, 21-2, ..., 21-P which function to process input elements, E, from the input stage 24-E, through each of the processing stages $P_1$, $P_2$, ..., $P_P$ designated as stages 21-1, 21-2, ..., 21-P, respectively, to produce the outputs, O, at output stage 21-O. The initial elements E in each of the stages 21-1, 21-2, ..., 21-P are work-in-process elements and the elements O at stage 21-O are the finished elements ready for shipment or other use.

In FIG. 8, the stages 21-1, 21-2, ..., 21-P include RF communicators (S-COM) 40-1, 40-2, ..., 40-P, respectively, that are in wireless communication with the RF tags $T_1$, $T_2$, ... $T_T$. Also, communicators (S-COM) 40-1, 40-2, ..., 40-P communicate with the management computer 41, including management memory 83, and hence the management computer 41 has access to information in each of the RF tags $T_1$, $T_2$, ..., $T_T$ and can store a remote copy in management memory 83. The communicators identified as 40-1, 40-2, ..., 40-P each connect through a network 46 to the management computer 41. A network connection 44 of the network 46 may be of any type such as local area networks (LANs), wide area networks (WANs), the internet, wired or wireless and any combination of network types. The management computer 41 stores and participates in the hierarchy of data storage in the FIG. 8 system and computer 41 maintains an information storage map indicating where information is stored in system 1

Figure 9:
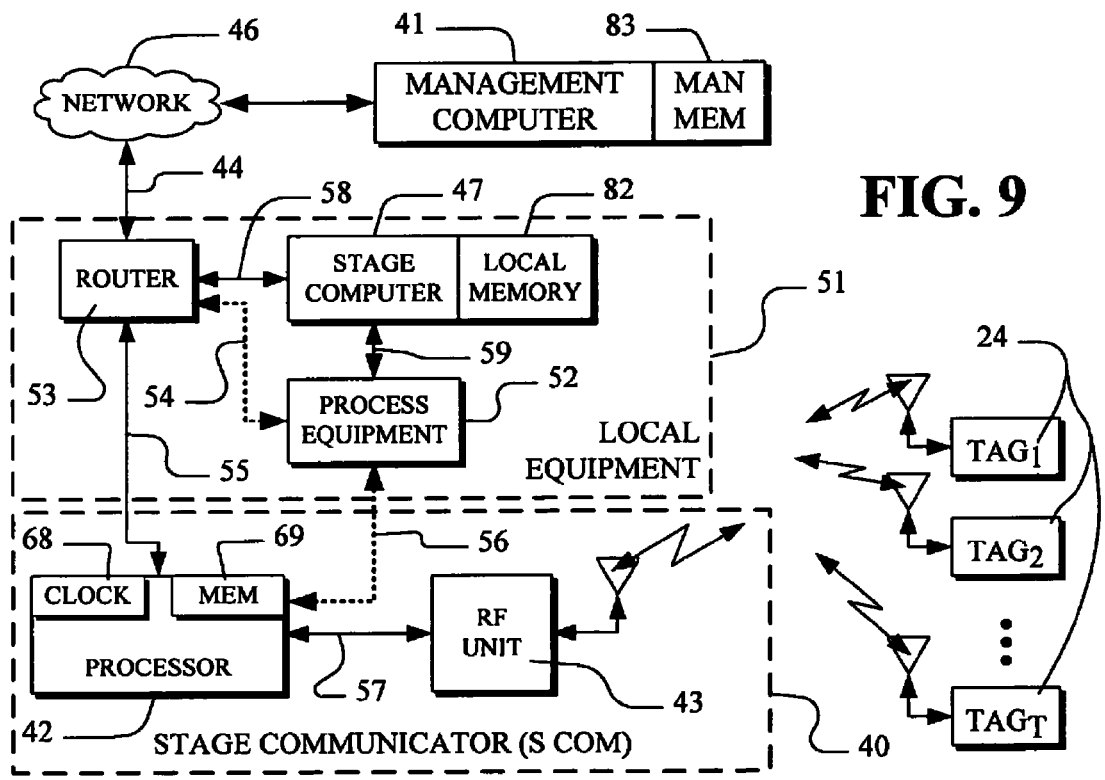
FIG. 9 depicts a typical stage communicator for RF communication with RF tags and for communication over a network to a management computer.

In FIG. 9, the stage communicator 40 (interrogator, reader, writer) is typical of the stage communicators 40-1, 40-2, ..., 40-P and 40-O of FIG. 8. The stage communicator 40 communicates with RF tags 24 bound to elements 22 where elements 22 are of the type described in connection with FIG. 1, FIG. 7 and FIG. 8. The stage communicator 40 includes an RF unit 43 for wireless communication with the RF tags 24. The RF unit 43 communicates with processor 42 over link 57. The stage communicator 40 communicates with RF tags 24, where the tags 24 are of the type bound to elements 22 described in connection with FIG. 1, FIG. 7 and FIG. 8. The processor 42 controls the transfer of information to and from the tags 24. The tags 24 respond to tag instructions that pass through the RF unit 43 and that are issued by the processor 42. Processor 42 stores and executes tag program routines that issue commands that write to, read from and otherwise access tags 24 where the routines typically use a Tag Instruction Set.

The processor 42 in some embodiments is integrated with the RF unit 43 as a single piece of equipment and in other embodiments the RF unit 43 and processor 42 are separated and are connected by a wired or wireless link 57. When separate, typically the connection between RF unit 43 and processor 42 operates according to a wireless WiFi 802.11 a/b/g standard, but any convenient communications link may be employed.

In FIG. 9, the local equipment 51 may be implemented in different ways. In one example, local processing equipment 52 includes automated equipment used in the processing steps performed at a stage. Since each stage in a chain of stages performs different functions, the processing equipment 52 differs from stage to stage to meet the needs of each particular stage. The processing equipment 52 in one embodiment connects over a link 54 to a router 53 to enable communication of the processing equipment throughout the system. The stage computer 47 is optional but typically is provided with conventional hardware elements such as local memory 82, displays, keyboards, interfaces and communications connections useful in controlling or otherwise cooperating with the processing equipment 52 over a link 59. The local memory 82 is available for storing copies of information stored in the tags 24. The computer 47 connects to processing equipment 52 via a link 59 and connects to a router 53 via link 58. The router 53 inter connects processor 42, network 46, stage computer 47 and process equipment 52. A connection link 44 connects the router 53 to the network 46 which connects to the management computer 41, including management memory 83. The network 46 typically includes a connection over the internet. The process equipment 52 optionally includes a direct link 56 to processor 42 to enable signaling to processor 42 of processing conditions that are useful for control or other operations.

In FIG. 9, the system architecture of the local equipment 51 may be of many forms apparent to those skilled in the art of system architecture. For example, all of the links 54, 55, 56 57, 58 and 59 may be wired or wireless according to conventional practices. When the connections are wireless, a wireless WiFi 802.11 a/b/g standard is typical, but any convenient communications link may be employed.

The processor 42 includes stored programs using a communicator Instruction Set that controls communications through the RF unit 43 and that implements a tag communication protocol for communications with tags 24. The wireless tags 24 store data, in one example, in data quantities in the range from 1 byte to about 128 kilo bits. The data is stored in the tags 24 at data addresses that are specified by the processor 42 when executing routines using instructions from an Instruction Set.

In one typical Instruction Set, the instructions rely on the fundamental operations performable by tags. Tags in a one embodiment have seven fundamental functions, namely READ, WRITE, ERASE, QUIET, TALK, LOCK and KILL. One typical Instruction Set for communicator 40 based on those seven commands for the tag is set forth in the following TABLE 1 including TABLE $1_{READ}$, TABLE $1_{WRITE}$, TABLE $1_{ERASE}$, TABLE $1_{QUIET}$ and TABLE $1_{TALK}$, TABLE $1_{LOCK}$ and TABLE $1_{KILL}$.

TABLE $1_{READ}$

| Instruction | Operation |
| --- | --- |
| READ Address (Tag Address, Returned Data) | The communicator reads data from a tag at a single specified tag address that has active status (not killed) using a single tag READ Command. |
| READ Filtered (Filter Argument, Returned Data) | The communicator reads data from tags at a plurality of specified tag addresses that have active status where the addresses are determined as those correlating to locations having a specified data content indicated by a Filter Argument. The Instruction issues multiple READ Commands to read the data, compares to see if data content matches Filter Argument and accepts data for those that do match and discards other data. |
| READ Selected (Start Address, Length, Returned Data) | The communicator reads data from multiple tags at selected tag addresses that have active status over an address range from a Start Address for a Length of addresses to a Stop Address. The Instruction issues multiple READ Commands, one for each address starting with Start Address and continues until Length is exhausted. |
| READ Killed (Tag Address, Returned Data) | The communicator reads data from a tag at a single specified tag address that has an inactive status (killed) using a single tag READ Command. |

TABLE $1_{WRITE}$

| Instruction | Operation |
| --- | --- |
| WRITE Address (Tag Address, Data) | The communicator writes data to a tag at a single specified tag address that has active status (not killed) using a single tag WRITE Command. |
| WRITE Filtered (Filter Argument, Data) | The communicator writes data to tags at a plurality of specified tag addresses that have active status where the addresses are determined as those correlating to locations having a specified data content indicated by a Filter Argument. The Instruction issues multiple Read Commands to read the data, compares to see if data content matches the Filter Argument and then issues a WRITE Command to write data for each that do match and does not issue a WRITE Command to the others. |
| WRITE Selected (Start Address, Length, Data) | The communicator writes data to multiple tags at selected tag addresses that have active status over an address range from a Start Address for a Length of addresses to a Stop Address. The Instruction issues multiple WRITE Commands, one for each address starting with Start Address and continues until Length is exhausted. |

TABLE 1$_{ERASE}$

| Instruction | Operation |
|---|---|
| ERASE Address (Tag Address, Data) | The communicator erases data in a tag at a single specified tag address that has active status (not killed) using a single tag ERASE Command. |
| ERASE Filtered (Filter Argument, Data) | The communicator erases data in tags at a plurality of specified tag addresses that have active status where the addresses are determined as those correlating to locations having a specified data content indicated by a Filter Argument. The Instruction issues multiple Read Commands to read the data, compares to see if data content matches the Filter Argument and then issues an ERASE Command to erases data for each that do match and does not issue a ERASE Command to the others. |
| ERASE Selected (Start Address, Length, Data) | The communicator erases data in multiple tags at selected tag addresses that have active status over an address range from a Start Address for a Length of addresses to a Stop Address. The Instruction issues multiple ERASE Commands, one for each address starting with Start Address and continues until Length is exhausted. |

TABLE 1$_{QUIET}$

| Instruction | Operation |
|---|---|
| QUIET Address (Tag Address) | The communicator commands a tag at a single specified Tag Address that has active status (not killed) to enter a QUIET mode where the tag no longer responds to or executes communicator commands using a single tag QUIET Command. The QUIET mode is maintained until a proper TALK command is received and is correctly interpreted or alternatively the QUIET mode is maintained until power has been removed from the tag for at least 1 second and at most 10 seconds. |
| QUIET Filtered (Filter Argument) | The communicator commands tags at a plurality of specified tag addresses that have active status where the tag addresses are determined as those correlating to locations having a specified data content indicated by a Filter Argument. The Instruction issues multiple READ Commands to read the data, compares to see if data content matches Filter Argument and commands tags to enter a QUIET mode for those that do match and does not change those where the data content does not match. |
| QUIET Selected (Start Address, Length) | The communicator commands tags at a plurality of specified tag addresses that have active status tags to enter a QUIET mode where the tag addresses are determined as those in an address range from a Start Address for a Length of addresses to a Stop Address. The Instruction issues multiple QUIET Commands, one for each address starting with Start Address and continues until Length is exhausted. |

TABLE 1$_{TALK}$

| Instruction | Operation |
|---|---|
| TALK Address (Tag Address) | The communicator commands a tag at a single specified Tag Address that has active status (not killed) to enter a TALK mode where the tag responds to and executes communicator commands. The TALK mode is maintained until a QUIET command is received and is correctly interpreted. |
| TALK Filtered (Filter Argument) | The communicator commands tags at a plurality of specified tag addresses that have active status where the tag addresses are determined as those correlating to locations having a specified data content indicated by a Filter Argument. The Instruction issues multiple READ Commands to read the data, compares to see if data content matches The Filter Argument and commands tags to enter a TALK mode for those that do match and does not change those where the data content does not match. |
| TALK Selected (Start Address, Length) | The communicator commands tags at a plurality of specified tag addresses that have active status to enter a TALK mode where the tag addresses are determined as those in an address range from a Start Address for a Length of addresses to a Stop Address. The Instruction issues multiple TALK Commands, one for each address starting with Start Address and continues until Length is exhausted. |

TABLE 1$_{LOCK}$

| Instruction | Operation |
|---|---|
| LOCK Address (Tag Address, Data) | The communicator locks data in a tag at a single specified tag address that has active status (not killed) using a single tag LOCK Command. |

TABLE 1$_{LOCK}$-continued

| Instruction | Operation |
| --- | --- |
| LOCK Filtered (Filter Argument, Data) | The communicator locks data in tags at a plurality of specified tag addresses that have active status where the addresses are determined as those correlating to locations having a specified data content indicated by a Filter Argument. The Instruction issues multiple Read Commands to read the data, compares to see if data content matches the Filter Argument and then issues a LOCK Command to lock data for each that do match and does not issue a LOCK Command to the others. |
| LOCK Selected (Start Address, Length, Data) | The communicator locks data in multiple tags at selected tag addresses that have active status over an address range from a Start Address for a Length of addresses to a Stop Address. The Instruction issues multiple LOCK Commands, one for each address starting with Start Address and continues until Length is exhausted. |

TABLE 1$_{KILL}$

| Instruction | Operation |
| --- | --- |
| KILL Address (Tag Address, Data) | The communicator kills a tag at a single specified tag address using a single tag KILL Command. When a Security Routine is required (optional), the Data provided is a security string. |
| KILL Filtered (Filter Argument, Data) | The communicator kills tags at a plurality of specified tag addresses where the addresses are determined as those correlating to locations having a specified data content indicated by a Filter Argument. The Instruction issues multiple Read Commands to read the data, compares to see if data content matches the Filter Argument and then issues a KILL Command to kill tags for each that do match and does not issue a KILL Command to the others. When a Security Routine is required (optional), the Data provided is a security string. |
| KILL Selected (Start Address, Length, Data) | The communicator kills multiple tags at selected tag addresses that have active status over an address range from a Start Address for a Length of addresses to a Stop Address. The Instruction issues multiple KILL Commands, one for each address starting with Start Address and continues until Length is exhausted. When a Security Routine is required (optional), the Data provided is a security string. |

Figure 10:
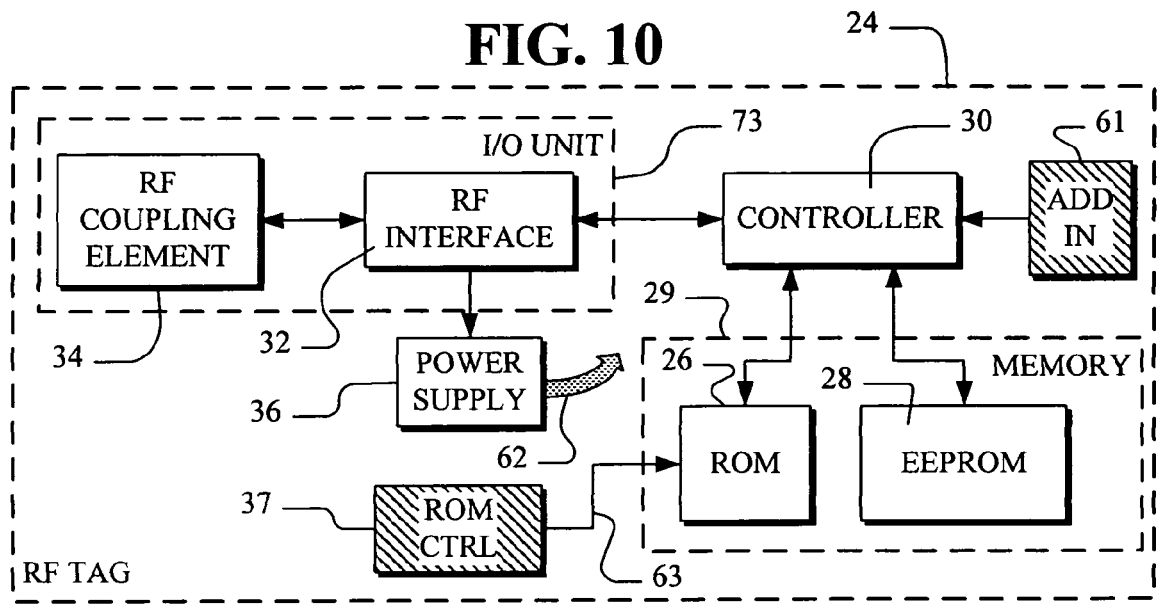
FIG. 10 depicts a typical RF tag of the type bound to elements.

FIG. 10 shows a functional block diagram of a typical RF tag 24 of the type bound to chain elements 22 as described in connection with FIG. 1, FIG. 7 and FIG. 8. The wireless tag 24 includes a memory 29 comprising a read only memory (ROM) 26 and an electrical erasable programmable random access memory (EEPROM) 28, a controller (CONTROLLER) 30, a radio-frequency interface (RF INTERFACE) 32, and a coupling element (RF COUPLING ELEMENT) 34. The RF-interface 32 provides power from the received RF signal to a power supply (POWER SUPPLY) 36 which generates a DC voltage (Vcc) on outputs 62 to power the other components of wireless tag 24. In some embodiments of tag 24, a ROM control (ROM CTRL) 37 provides a control input 63 to ROM 26 to enable data to be written into ROM 26. In some embodiments of tag 24, an address circuit (ADD IN) 61 provides address bits to controller 30 for distinguishing multiple tags on the same die. The RF-interface 32 and the coupling element 34 comprise the input/output (I/O) unit 73 for electronic communication with the stage communicator 40 of the type described in connection with FIG. 9 for processing tag information.

The tag 24 communicates with communicator 40 of FIG. 9 through the coupling element 34. The coupling element 34 is typically an antenna of the type having its impedance modulated by signals from RF interface 32. The ROM 26 is typically one-time programmable (OTP) and is used to store permanent data, such as a Die ID (also called "Chip ID"). The ROM 26 can be an electrically programmable ROM (EPROM), which permits information to be entered through electrical means, and/or can be a mask ROM, which permits information, be stored through a mask layout during the manufacturing process. When ROM 26 is an electrically programmable device, an enable signal on line 63 allows the controller 30 to address and store data into ROM 26 to initialize the tag 24. The EEPROM 28 is many-times programmable (MTP) and is used to store other types of data (for example, customer number and test results of functional tests for the die). In an alternative embodiment, a portion of EEPROM 28 can be configured to serve the function of ROM 26 and that portion thus configured can be electrically programmed Each tag typically has an identifier for security applications. The identifier typically comprises the Tag ID and a password that are used according to a security protocol for communication with a communicator.

In one preferred embodiment, the controller 30 of FIG. 10 executes only the fundamental commands READ, WRITE, ERASE, QUIET, TALK, LOCK and KILL. An Instruction Set as described in connection with TABLE 1 using those commands is located in the processor 42 of FIG. 9. Sequences of instructions using instructions in the Instruction Set are executed by the processor 42 in the communicator 40 of FIG. 9. Each executed instruction in a sequence of instructions causes commands to be issued to the controller 30 which in turn commands the operation of the tag of FIG. 10. In an alternative embodiment, an Instruction Set interpreter is imbedded in the controller 30 of FIG. 10. In such an embodiment, the processor 30 issues instructions from a program (routine of instructions) of the Instruction Set directly to controller 30 and controller 30 interprets those instructions in a manner that is the equivalent of a executing a series of commands.

The memory 29 operates to read and write data under control of the controller 30. The controller 30 receives communications from the communicator 40 of FIG. 9. Among other parts, the instructions include address fields that typically include DieID, AddIn, MemIndicator, Address and Command as well as Data fields. The DieID field is a unique address of the die on the wafer, in a Wafer Lot, and in a Wafer Batch. The AddIn field is a field for identifying a particular one of the tags on a die when a die has more than one tag. The MemIndicator field indicates a particular one of memories when multiple memories are present in a tag, for example memories in the form of ROM 26 and EEPROM 28 in FIG. 10. The Address field specifies the tag addresses location in the memory 29. The Command field indicates the particular operation (for example, READ or WRITE) to be executed by the controller 30 at the tag address. The Data field supplies or receives data to or from the memory 29.

The wireless tag 24 is manufactured in or attached to wafers for individual dies, for wafers, for lots or for batches and for storage and retrieval of any type of information useful in management or other systems.

When the wireless tag 24 is not within an interrogation zone of a communicator 40, it is passive. When within the interrogation zone, the wireless tag 24 is commanded to operate by signals transmitted from the communicator 40. To write data, a write command instructs the wireless tag 24 to perform a write operation and data from the communicator 40 is stored into the writable memory EEPROM 28 of the wireless tag 24. To read data, a read command signal from the communicator 40 instructs the wireless tag 24 to perform a read operation. After the tag 24 receives a read command, the tag 24 sends data read from the memory 29 to the communicator 40. The tag 24 and coupling element 34 is not directional and the sensing sensitivity typically ranges from −6 dBm to −18 dBm. The sensing speed (including handling of the data carrier) is typically shorter than about 0.1 second and is faster than barcode readers that are typically about 4 seconds. The RF tags 24 operate effectively over a range from less than 1 m to about 100 m.

In normal operation after a tag has been initialized, when the tag 24 is in the proximity of an active communicator 40 of the FIG. 9 type, the power supply 36 energizes the tag 24 to be active for operation. The controller 30 receives commands from communicator 40 through coupling unit 34 and interface 32. Upon receiving a communication, controller 30 operates first to compare the DieID received with the communication with a DieID stored in ROM 26. If they match, then controller 30 compares the received AddIn field with the AddIn field provided by AddIn unit 61 and if they match, the tag 24 is enabled to execute the received command. The controller 30 examines the command field of the received communication and then executes the command. In the example described, the command is one of the seven commands READ, WRITE, ERASE, QUIET, TALK, LOCK and KILL used by the instructions from the communicator 40 of FIG. 9 defined in the Instruction Set of TABLE 1.

Prior to normal operations, tag 24 must be initialized to store a Tag ID that uniquely identifies the tag. The initialization of add-on tags (tags that are glued on or otherwise attached) and native-formed tags (tags that are manufactured using the native processing used for other circuits on a die) may differ. Several methods are used for initializing native-formed tags.

One initialization method for native-formed tags operates after the dies have become functional on a wafer which normally occurs near the end of the fab stages and before the sort stages. A specialized RF wafer scanner is positioned over each tag on a die one at a time. The RF scanner stores a Tag ID and other permanent data into the ROM 26 and thereafter the ROM becomes read only and can be interrogated by normal operation of the communicator 40 of FIG. 9 which operates at much greater distances than the specialized initialization scanner.

In environments where a large number of tags are attempting to communicate and bandwidth availability needs to be controlled, an argument in the READ Filtered instruction, hereinbefore described can be used to reduce the number of responding tags to control communications to be within the bandwidth of the communicator and tags.

Figure 11:
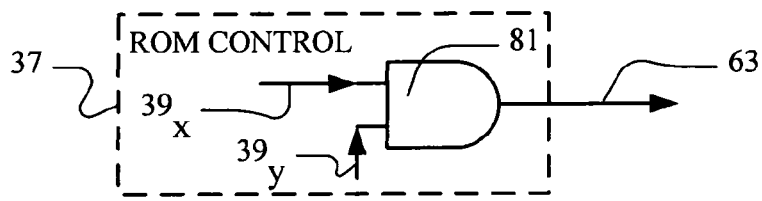
FIG. 11, FIG. 12 and FIG. 13 depict different embodiments of the ROM control in the tag of FIG. 10.
Figure 12:
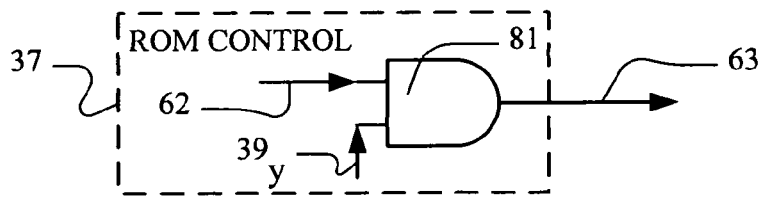
Figure 13:
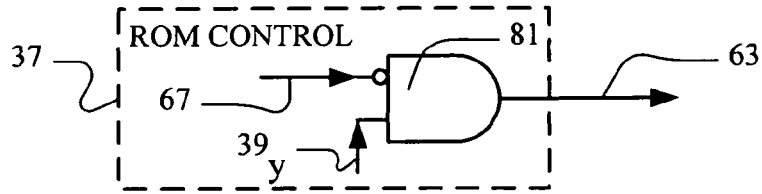

In FIG. 11, FIG. 12 and FIG. 13, the ROM control 37 of FIG. 10 is shown in different embodiments used in connection with methods of initializing native-formed tags on dies on a wafer. In FIG. 11, the ROM control 37 has two input lines that connect to AND gate 81. When power is applied to the two input lines, AND gate 81 is satisfied and therefore a write enable signal on line 63 is provided to the ROM 26. In FIG. 11, the two input lines 39x and 39y to AND gate 81 are from die pads of a die on a wafer (see FIG. 14). In FIG. 12, the input line 39y is from a die pad of a die on a wafer (see FIG. 14) and the line 62 is from the power supply 36 of FIG. 10. In FIG. 13, the input line 39y is from a die pad of a die on a wafer (see FIG. 14) and the line 67 is a ground plane connection (see FIG. 16) of a die on a wafer that connects through an inverting input to the gate 81. The ROM control 37 of FIG. 11, FIG. 12 and FIG. 13 includes AND gates with non-inverting or inverting inputs. Other types of logic gates, such as NAND gates, with and without inverting inputs and outputs can be employed.

When ROM 26 is enabled as described in connection with FIG. 11, FIG. 12 and FIG. 13 or is otherwise enabled in an equivalent manner, a communicator 40 of the FIG. 9 or equivalent type is then operated to write initialization data into ROM 26. When the power on either of the input lines to the AND gate 81 is removed, the ROM thereafter becomes and remains read only for normal tag operations.

The two input lines to the AND gate 81 become powered during a wafer sort test in each of the embodiments of FIG. 11, FIG. 12 and FIG. 13. During a sort test, dies are selected by application of DC power a die at a time. When the DC power is applied to one particular die for the sort test, the tag 24 for that particular die also receives the DC power. When thus powered during sort processing, the Tag ID is written into the tag 24 by operation of communicator 40 executing an Initiation routine. For other dies that are not being powered, the tag 24 on each of the not-selected-dies is passive. As each die is selected for sort testing, the Tag ID and other initialization data is written until all die tags have been initialized by execution of the Initialization routine.

Once a Tag ID is written during the initialization process, the tag is uniquely addressable using the Tag ID. Once a tag is initialized with a Tag ID, normal communication with that tag can occur allowing other information (such as testing results) to be stored into the tag's memory while sort testing on that die continues. Once the tag on one die is initialized, the process is repeated to initialize the next tag on the next die until all of the dies and tags are DC powered, sorted and initialized.

When tags are not manufactured as part of the native die processing on a wafer, the tags are added to each die by an add-on process. The add-on process employs well-known technologies for "gluing" a tag to the die. The electrical circuits of the add-on tags are functionally the same as the electrical circuits of the native-formed tags. The add-on tags are preferably initialized prior to attachment to the die and hence the initialization processes for native-formed tags are not required. Therefore, the ROM control 37 is not required.

Figure 14:
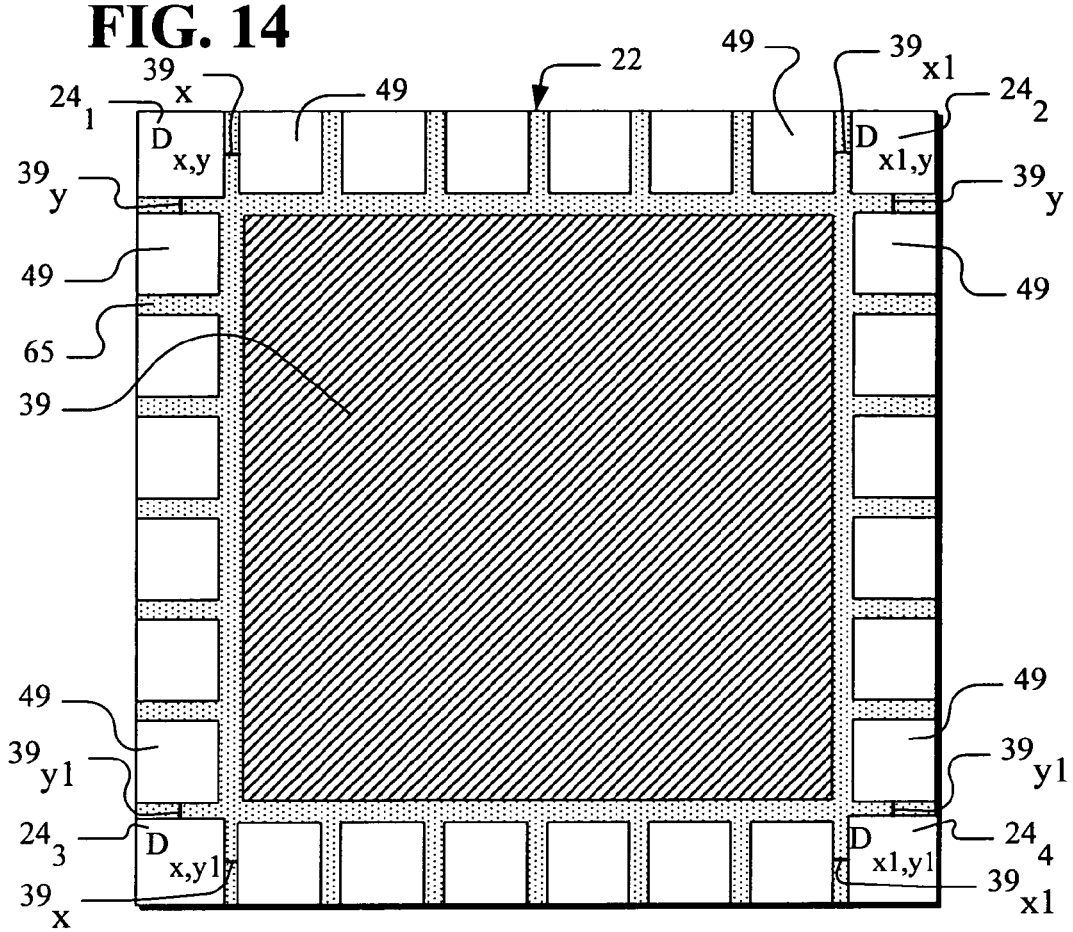
FIG. 14 depicts a typical semiconductor die having bound RF tags.

In FIG. 14, the semiconductor die 22 is a typical die that has four bound RF tags 24, including tags $24_1$, $24_2$, $24_3$ and $24_4$ that store the Tag IDs $D_{x,y}$, $D_{x1,y}$, $D_{x,y1}$ and $D_{x1,y1}$. Four tags can be provided in some embodiments since in many designs the corner positions of dies are left vacant. The inclusion of more than one tag per die is useful for adding extra storage capacity per die and/or for having redundancy. Redundancy is useful when high reliability is desirable. The inclusion of one or more tags normally does not interfere with the normal layout and functioning of the native circuitry 39 on a tag. Although four tags on a die are shown by way of example, the number of tags on each die can be a different number, and can be less than four depending on the vacant space in the corners of the die or other die layout considerations. The RF tags 24 are physically bound to the die 22. In one embodiment the tags 24 are manufactured and imbedded as electronic circuits using the native processing technology used for the circuitry 39. In another embodiment, the RF tags 24 are manufactured with an external process technology and the tags are then attached to the die 22 as add-on tags. In either of the embodiments, the RF tags are bound to the dies and remain with the dies through all subsequent chain stages. The area occupied by one tag 24 is typically approximately 1/100 or smaller of the area of the die 22.

In FIG. 14, when more than one tag is present on a die, each tag design may be different. In a typical example with four die as shown in FIG. 14, the tag designs are all the same and are as shown in FIG. 10 except that the ADD IN circuit 61 differs on each tag in order to provide a unique address to distinguish each of the four die from each other. Logically, each tag on a die provides different low-order address bits to distinguish it from each of the other tags. In an actual implementation for four die, two low-order address bits are provided by ADD IN circuit 61 on each die. The two low-order address bits are provided, for example, by two voltage levels (such as Vcc and ground) representing logical "1" and logical "0". The two low-order address bits are coded for tags $24_1$, $24_2$, $24_3$ and $24_4$ as 00, 01, 10 and 11, respectively. The two coded voltage levels are provided using switches, direct wire connections (e.g. metal wires or interconnects) or any other convenient method. Switches or direct wire connections with coded values are readily implemented using mask layout patterns with well-known mask-ROM technology.

In FIG. 14 for an example useful with FIG. 11, different ones of the die pads 49 connect to the input lines $39_x$ and $39_y$ of tag $24_1$, connect to the input lines $39_{x1}$ and $39_y$ of tag $24_2$, connect to the input lines $39_x$ and $39_{y1}$ of tag $24_3$ and connect to the input lines $39_{x1}$ and $39_{y1}$ of tag $24_4$. The pair of input lines $39_x$ and $39_y$, the pair of input lines $39_{x1}$ and $39_y$, the pair of input lines $39_x$ and $39_{y1}$ and the pair of input lines $39_{x1}$ and $39_{y1}$ are energized with DC power when the die is energized for a sort test. The tags $24_1$, $24_2$, $24_3$ and $24_4$ are each powered during the sort test and are separately initialized by operation of coordinator 40 of FIG. 9 addressing each of the tags and relying on the low-order bits from the ADD IN circuit 61.

When the wireless tag 24 is manufactured with native semiconductor processing, the data base data specifying the layout patterns for the native tags 24 and for the circuitry 39 are merged into one common database. The layout patterns incorporating the tags 24 and the circuitry 39 are printed on a set of manufacturing masks and are processed simultaneously in the semiconductor processing. As a result, native imbedded wireless tags 24 are part of the die 22 at the completion of processing. Due to the broad acceptance of standard CMOS processing, a wireless tag design based on standard CMOS processing is an embodiment convenient for many semiconductor manufacturers. The wireless tag 24, however, can be designed based on other types of process technologies, such as BiCMOS (i.e. technology combining a bipolar process and CMOS process), embedded non-volatile memory technologies (i.e. technology combining a non-volatile memory process and a CMOS process), or any other type of technology that permits manufacturing of integrated circuits. The non-volatile memory process can be a process manufacturing Flash EEPROM, Ferroelectric RAM (FRAM), Magnetic RAM (MRAM), Phase-Change RAM (PCRAM), Organic RAM (ORAM), and Conductive Bridging RAM (CBRAM) all well-known in the art.

Figure 15:
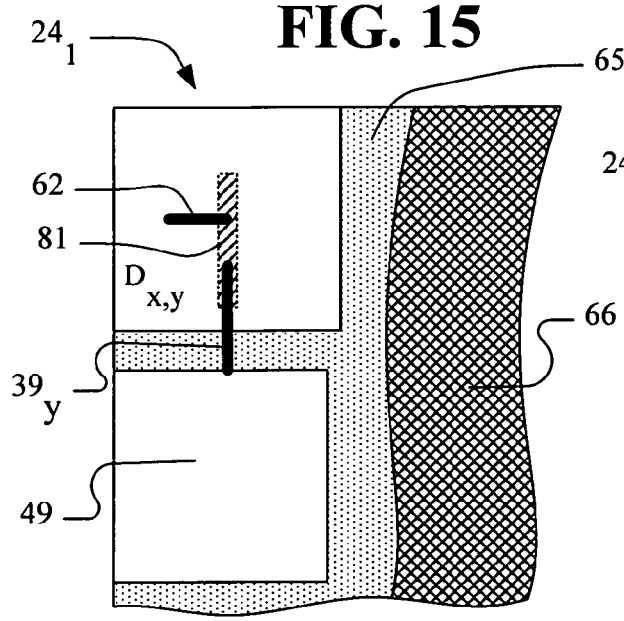
FIG. 15 depicts a portion of the die of FIG. 14 with an alternate wiring layout.

In FIG. 15, an alternate example of a portion of the die of FIG. 14 is shown that is useful with the FIG. 12 embodiment. The die pad 49 connects to the input line $39_y$ of tag $24_1$ and die pad 49 is located on top of the insulating layer 65 which is located on top of a conductive layer 66 which typically comprises a semiconductor substrate. The input 62 of gate 81 has a trace making contact to an output from the power supply 36 (see FIG. 10) internal to the tag $24_1$.

Figure 16:
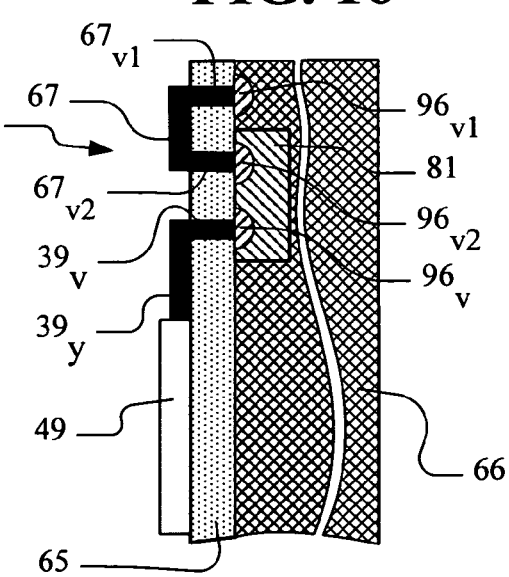
FIG. 16 depicts a portion of the die of FIG. 14 with another alternate wiring layout.

In FIG. 16, an alternate example of a portion of the die of FIG. 14 is shown that is useful with the FIG. 13 embodiment. The tag $24_1$ is a multilayer structure including a gate 81. The gate 81 receives one input $39_y$ and another input 67. The input $39_y$ is a trace that connects on the surface of layer 65 between pad 49 and the via $39_v$. The via $39_v$ is a connection through the insulating layer 65 to a first electrode $96_v$ of gate 81. The other input 67 to gate 81 connects as a trace on the surface of layer 65 between the via $67_{v1}$ and the via $67_{v2}$. The via $67_{v1}$ is a connection through the insulating layer 65 to an electrode $96_{v1}$ of region 66. The via $67_{v2}$ is a connection through the insulating layer 65 and connects to a second electrode $96_{v2}$ of gate 81. The gate 81 has an output (not shown) that connects to other circuitry (not shown) for tag $24_1$ as described in connection with FIG. 10 and FIG. 13. The FIG. 16 structure is schematic and any conventional structure can be employed that provides internal connections with appropriate logical levels to gate 81.

Figure 17:
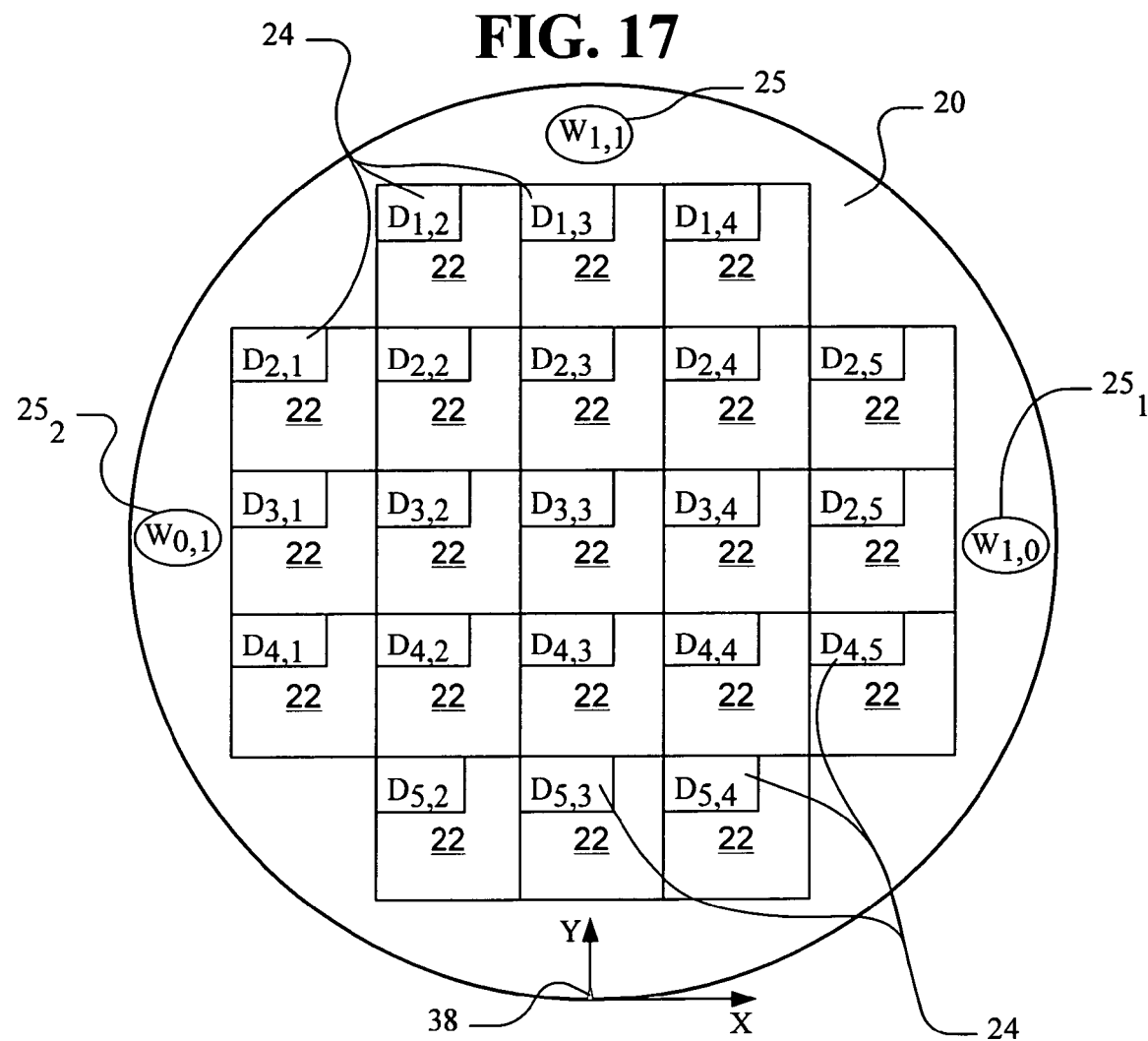
FIG. 17 depicts a semiconductor wafer having a plurality of dies where the wafer includes a Wafer RF tag and each die includes a die RF tag.

In FIG. 17, a semiconductor wafer 20 includes a plurality of dies 22 like the die 22 shown in FIG. 14. The wafer 20 includes a Wafer RF tag 25 and each die includes at least one die tag 24 and, as indicated in FIG. 14 each die 22 has up to four die tags 24. For clarity, the wafer 20 is an example with a small number (21) of die 22 but die densities can be as high as 3000 die per wafer or more. For identification purposes, the dies 22 are provided with a name and, by way of the FIG. 17 example, the naming is in rows and columns, including 5 rows and 5 columns. The first row die are $D_{1,2}$, $D_{1,3}$, $D_{1,4}$, the second row die are $D_{2,1}$, $D_{2,2}$, $D_{2,3}$, $D_{2,4}$, and so on until the final row of die are $D_{5,2}$, $D_{5,3}$, $D_{5,4}$. As indicated in FIG. 10, each tag 24 includes memory 29 and the name and address of each tag is electronically stored in the tag. Each die tag 24 stores other information about the die including a Wafer ID, a Lot ID and a Batch ID so that the die's origin can be determined from the die even after the die is cut from the wafer and further processed in subsequent stages and in subsequent chains of stages. Also, the physical location (that is, the X and Y coordinates) relative to an XY-axis coordinate system is known relative to an origin point 38 identified by a notch at the bottom of wafer 20. The physical location (that is, the X and Y coordinates) relative to the XY-axis coordinate system are determined according to industry standards based upon the wafer size (diameter), the die size (length and width) and the X and Y address coordinates. Based upon a standard guard ring around the perimeter of the wafer, the location of each die relative to the origin point 38 can be calculated from the wafer size and the die size. As the die is processed from stage to stage in a chain, additional information is added to the die tag memory to record the relevant processing information.

In FIG. 17, the Wafer RF tag 25 is an electronic circuit of the type shown in FIG. 10 and includes memory 29 and the other non-shared elements of FIG. 10. The Wafer RF tag 25 stores information about the wafer and about each die 22 on the wafer. During the processing of a wafer, Die Map information is created for storage in the Wafer RF tag 25 to enable the location of each die 22 on the wafer 20 to be calculated. The die map information is derived from the standard "wafer map" typically generated at the first running of the engineering wafers after design tape out. The exact location of each die is determined from the information stored in the Wafer RF tag 25. The Wafer RF tag 25 is typically attached as an add-on tag during one of the final steps of the Wafer fab processing and before the sort stage. The Wafer RF tag 25 is attached at top of the wafer 25. One or more additional RF tags, such as tags $25_1$ and $25_2$, can also be provided on the wafer 20. The inclusion of more than one wafer tag per wafer is useful for adding extra storage capacity per wafer and/or for having redundancy. Redundancy is useful when high reliability is desirable.

Figure 18:
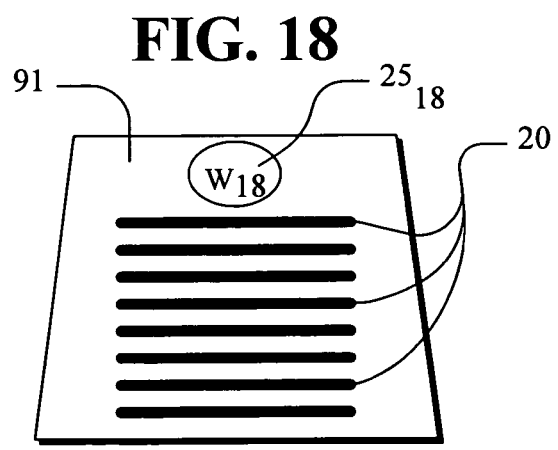
FIG. 18 depicts a schematic front view of a wafer carrier case typical of the carrier cases used for transporting wafers during wafer processing.

In FIG. 18, a wafer carrier case 91 is typical of the carrier cases used for wafer processing. In the initial stages of wafer processing, wafers are held in the carrier cases and wafer tags, like the tags 25 attached to the wafers of FIG. 17, are attached to the carrier cases. The wafer carrier case 91 stores a number of wafers 20. At each wafer processing station, the wafers 20 are unloaded from carrier case 91, are processed, and are placed back into the carrier case 91. Such stations are examples of the stages 21 described, for example, in connection with FIG. 1, FIG. 2 and FIG. 3. During initial wafer processing stages, electronic tags like tag 25 of FIG. 17 cannot be used on the wafers because of the high temperatures and other severe processing conditions necessary for wafer processing. Accordingly, a tag $25_{18}$ is attached to the carrier case 91 and functions to store information about the wafers. Preferably, the tag $25_{18}$ is like the tag 25 of FIG. 17 and can be communicated with using the same type of communicator 40 of FIG. 9. When processing of wafers 20 reaches the end of the fabrication stage and before the sort stage, the information from the carrier case tag $25_{18}$ is stored into the wafer tag of each wafer 20, like wafer tag 25 of FIG. 17 Some or all of the carrier case tag $25_{18}$ information, such as Wafer ID and Lot ID, can be also stored into the die tags on each die of each wafer, like die tags 24 of FIG. 14 (identified as $24_1$, $24_2$, $24_3$, and $24_4$). In this manner, the tag communication protocol, the memory allocation and the communicators and other equipment remain consistent over the full processing chain.

In FIG. 19, for a Ball Grid Array package, the die (chip) 22 in an exploded view is positioned above a ball array chip carrier 92. The die 22 is typical of any of the die 22 of FIG. 17. The die 22 includes the connection pads 49, including typical pads $49_1$ and $49_2$, around the perimeter but excluding the corners. In the corners are located four bound RF tags $24_1$, $24_2$, $24_3$ and $24_4$ and in the center are the circuits 39. Ball Grid Array packaging is well known in the semiconductor industry and has many variations. The ball array chip carrier 92 includes an array of connection pads 48 (identified as $48_1$ and $48_2$ for illustration). Such pads are around the perimeter for electrical connection to the pads 49 on the die 22. In the internal region of carrier 92, via pads 44 are located in an array. Each via pad 44 is for connection through a via from one side (shown) of the carrier 92 to the other side (see FIG. 20) of the carrier 92. Each of the pads 48 is connected to a different one of the via pads 44 by a conductive trace where trace $43_1$ connecting from pad $48_1$ to via pad $44_1$ is typical. When assembled, the bottom side of chip 94 is placed down over the region of the via pads 44.

In FIG. 20 a schematic, isometric bottom view of the ball array chip carrier 92 of FIG. 19 is shown. The chip carrier 92 includes an array of contact balls 93 of which ball $93_1$ is typical.

In FIG. 21, a schematic sectional view of a Ball Grid Array (BGA) package 90 is shown and includes a chip carrier 92 and a die 22 viewed along section line 21-21' of FIG. 19 with the chip carrier 92 and die 22 assembled. The assembled package 90 includes an insulating attaching layer 46 attaching the die 22 to the carrier 92 and includes an insulating compound 94 encapsulating the package 90. In FIG. 21, the pads $49_1$ and $49_2$ on the die 22 connect to the pads $48_1$ and $48_2$, respectively, by the conductive wire bonds $47_1$ and $47_2$, respectively. The pad $48_1$ connects to the via pad $44_1$ by the trace $43_1$. The via pad $44_1$ connects by the via $45_1$ through from the top surface of the carrier 92 to the ball $93_1$ on the bottom surface of carrier 92.

The package 90 in one embodiment includes a tag $25_{21}$, like the tag $25_{18}$ of FIG. 18, for storing die and other information useful in semiconductor processing stages and useful in other stages and chains of stages. The tag $25_{21}$ is shown located on top of the package 90, but in alternate embodiments any one or more such tags can be located anywhere on or in the package 90. The tags $24_1$, $24_2$, $24_3$ and $24_4$ and tag $25_{21}$ can all be present or alternatively, only any one or more of the tags may be present.

The attachment of tags in the semiconductor examples of FIG. 14, FIG. 17, FIG. 18 and FIG. 21 are representative of a broader principle applicable in many industries where low level elements and initial elements (such as dies, wafers, wafer carriers and packages in the semiconductor industry) are processed through multiple stages and multiple chains of stages to form final elements and goods. In industries where the origin and tracking of elements through many stages of process is important for quality, safety, efficiency or other reasons, then tag tracking is a useful and important tool.

Figure 22:
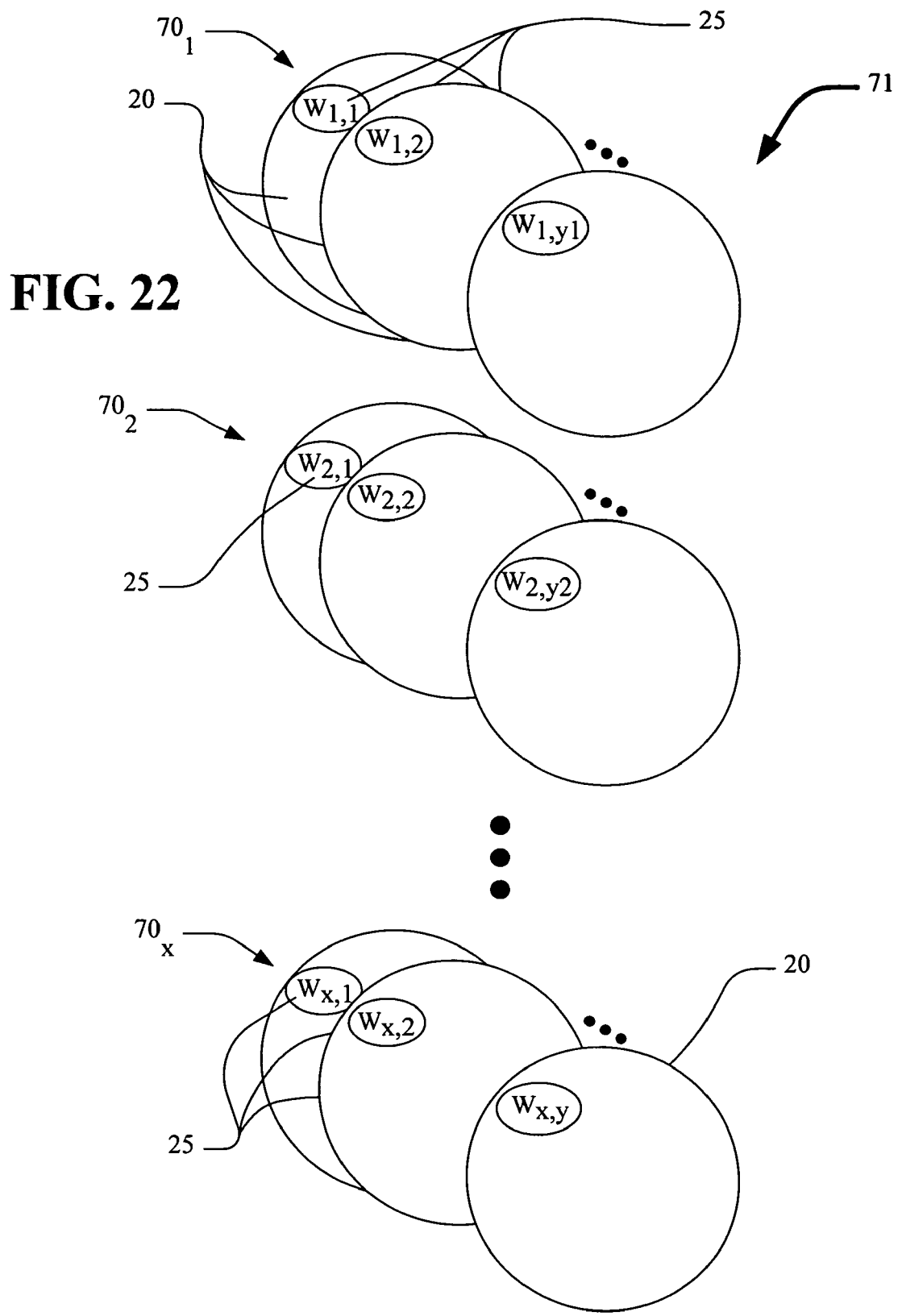
FIG. 22 depicts a plurality of wafer lots forming a wafer batch.

In FIG. 22, a plurality of wafer lots $70_1$, $70_2$, ..., $70_x$ of wafers 20 form a wafer batch 71 where each wafer 20 includes dies (not shown but see FIG. 17) each having RF die tags (not shown but see FIG. 17). For identification purposes, the wafers 20 of FIG. 18 are provided with a name and the naming is in rows, where each row is a Lot and columns. The first lot is wafers $W_{1,1}$, $W_{1,2}$, ..., $W_{1,y1}$, the second lot is $W_{2,1}$, $W_{2,2}$, ..., $W_{2,y2}$ and so on until the final lot is $W_{x,1}$, $W_{x,2}$, ..., $W_{x,y}$. Each wafer 20 in FIG. 22 includes a wafer tag 25 like the tag 24 of FIG. 10 except that the ROM control 37 and ADD IN 61 circuits are not needed. The name and address of each wafer is electronically stored in the wafer tag 25. Each wafer tag 25 stores other information about the wafer including a Wafer ID, a Lot ID and a Batch ID so that its origin can always be determined until the wafer is cut into separate individual die.

Figure 23:
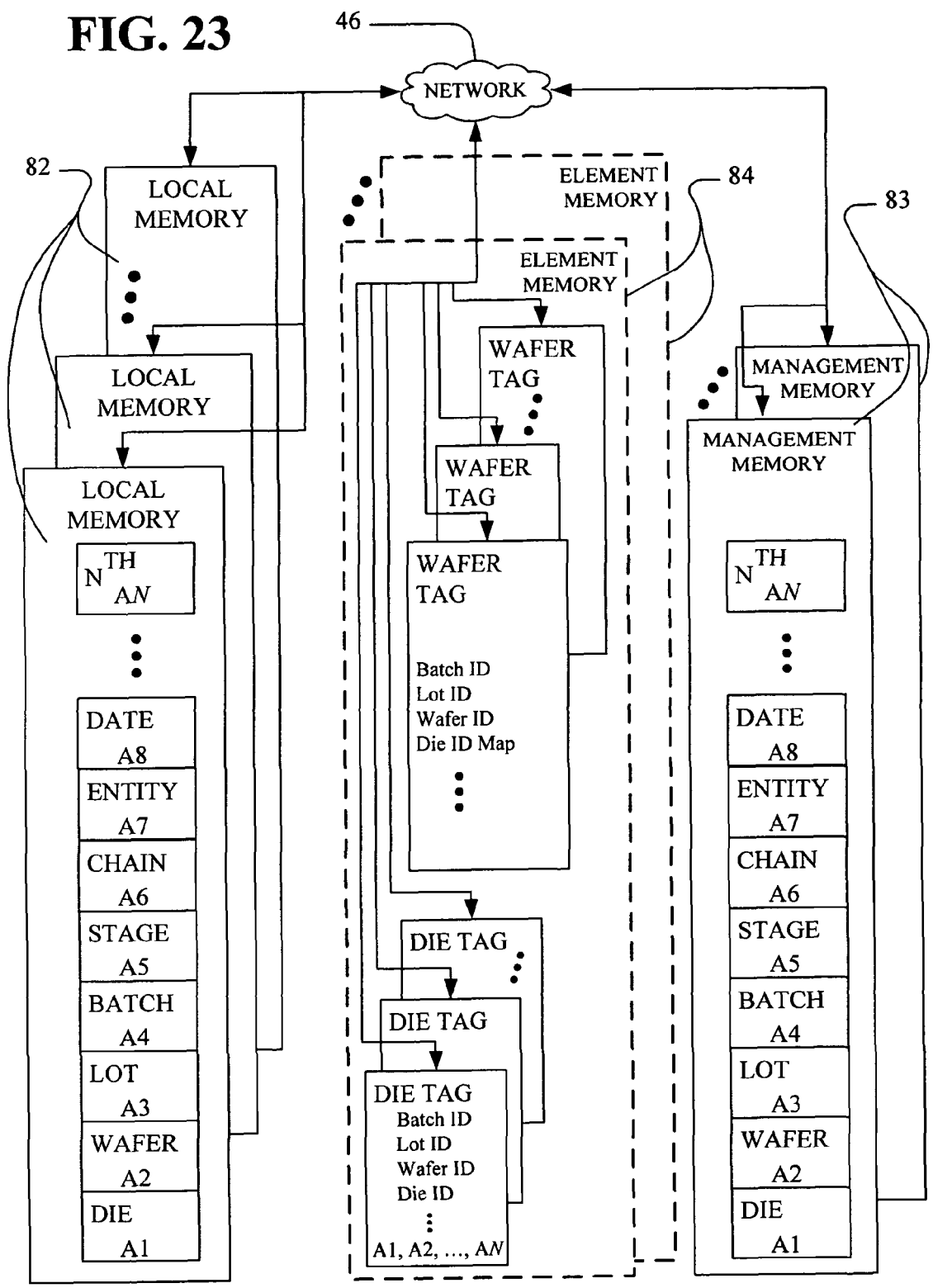
FIG. 23 depicts one example of a memory architecture determining where information is stored in the management system.

In FIG. 23, a hierarchical memory configuration and addressing architecture is shown depicting multiple levels of memory, redundant storage of information with unique and universal addressing. The memory in FIG. 23 includes the element memory 84 which includes tag memory such as in die tags (see tag 24 and memory 29 in FIG. 10, for example) and wafer tags (see tags 25 in FIG. 17 and memory 29 in FIG. 10, for example). The memory in FIG. 23 includes the management memory 83 (see memory 83 in FIG. 1, FIG. 8 and FIG. 9, for example). The memory in FIG. 23 includes local memory 82 (see local memory 82 in FIG. 9). The management memory 83, as shown in FIG. 1, FIG. 8 and FIG. 9, can be in a single computer system, such as management system 41 of FIG. 1, or can be duplicated in multiple computer systems. The local memory 82 in the local equipment 51 of FIG. 9 is duplicated at each of the stages of one or more chains and hence many local memories 82 are shown in the FIG. 23 memory architecture. The element memories 84 are duplicated many times in the system and, in a semiconductor example, are present on each of the dies and wafers processed in the stages and chains throughout the system. Many millions of elements, such as wafers and dies in a semiconductor example, are processed and therefore the addressing of the memory locations for each element and the data stored on each element is established with a memory architecture that avoids confusion and operates within the capacities of the memories.

The addressing of the memory of FIG. 23 and of all the memories described employs an address (some times called an identity indicator) allocation with N-Field addresses, or subsets thereof, including the address fields A1, A2, ..., AN. In a semiconductor example, the address fields A1, A2, ..., AN are defined in one example as follows: Die ID (A1), Wafer ID (A2), Lot ID (A3), Batch ID (A4), Stage ID (A5), Chain ID (A6), Entity ID (A7), Date/Time (A8), ..., (AN). Any field in the tag storage can be defined when desired as one of the address fields A1, A2, ..., AN. When desired, any selected elements, including the low level elements such as the tags 24 in dies 22 of a wafer, store all the complete address information A1, A2, ..., AN. With such storage of the full address information, a die can be addressed and identified after it has been cut from a wafer and after it has been incorporated into finished goods, even if the die has passed through many processing chains. The memory architecture of FIG. 23, representing the architecture of the management systems described, is defined as a universal addressing architecture for transported memory. Transported memory is memory that is transported from state to stage of processes in an environment where associations with elements can be lost in the absence of universal addressing. For example, die tag memory when a die is part of a wafer is physically associated with the wafer. However, when the wafer is cut, the die loses the physical association with the wafer. However, if the wafer information is stored in each die tag, then transporting the die tag memory (with the die) retains the association of the die with the wafer.

While universal addressing has utility in the semiconductor field, many other fields also benefit. By way of further example, the pharmaceutical field processes medicines through many stages which may start with many input ingredients (each an initial element) to form a large batch of material (first intermediate element), that may be processed to form smaller batches (second intermediate elements) that are in turn processed to form outputs (final elements) such as pills. Tags attached to elements or containers for elements at each stage of processing maintain the entire history of the processing. A pill tag attached to the container for pills dispensed is updated with information from all of the prior elements and hence includes universal addressing. Should a safety recall occur, the pill tag with universal addressing stores relevant information so that the history of any particular tag and hence pill can be read. The reading of information is done, for example, by a communicator as described in connection with FIG. 9.

In FIG. 23, the addressing information stored in the lowest level element, when desired, is redundantly stored in higher level memories in the hierarchy. For example, all or some subset of the information stored in die memory for each die of a wafer can also be stored in wafer tag memory, stored in local memory and stored in management memory and in any duplicates and backups thereof.

In addition to storage of universal address information, the memory of FIG. 23 and all the memories described also store all, or some subset thereof, of the data fields D1, D2, ..., DM pertaining to elements. The data fields D1, D2, ..., DM typically store data such as good/fail information, yield information and types of processes employed in the case of a semiconductor example.

The extent to which data and address storage is available is, in part, a function of memory capacity. Of course, memory capacity of a die tag or other element can be increased, but if the increase requires more than four tags, then the increase may require a reduction of the area available for the native circuitry. In a typical tag 24 as described in connection with FIG. 7, the tag memory capacity is up to 128 kilo bits so that a die with 4 tags has a capacity of up to 512 kilo bits, or approximately 0.5 mega bits. The die memory capacity on a wafer has a capacity as a function of the number of die per wafer. For a wafer with 21 die and four tags per die, the die memory capacity is 10 mega bits ($1 \times 10^7$ bits). For a wafer with 3000 die and four tags per die, the die memory capacity is 1.5 giga bits ($1.5 \times 10^9$ bits). If redundancy is employed for any memory, then the effective capacity is reduced by the amount of redundancy.

Examples of the information stored in the tag memory appears in the following sample TABLE 2 including TABLE 2—Foundry, TABLE 2—Sort, TABLE 2—Assembly, TABLE 2—FinalTest and TABLE 2—FinishedGoods.

In TABLE 2, coding schemes may be of various types or any combination thereof. Common coding schemes include binary, ASCII, Extended ASCII, IBM EBCDIC, and hexadecimal, but any scheme whether well known or not may be employed. In binary coding, each bit has a logical "1" or logical "0" value. In Extended ASCII coding, each character is represented by 8 binary bits. In hexadecimal coding, each character is represented by 4 binary bits. While any coding scheme or combination of schemes can be employed, the coding schemes used affect the ease of use and the ease of understanding by users and affect the amount of memory required to store information. While Extended ASCII characters are widely recognized and easy to understand, they require more bits (8 per character) than Hexadecimal characters that requires fewer bits (4 per character). In order to reduce the number of bits, Hexadecimal character codes are employed in some fields. An example of the use of hexadecimal characters is given for the row and column identification of a die on a wafer. The row address is defined $R_h, r_h$ and the column address is $C_h, c_h$ where the subscript "h" indicates that the character is hexadecimal. The row address is represented by two hexadecimal characters, namely, $R_h$, and $r_h$. Each hexadecimal character has 16 different possible values (identified as 0, 1, 2, 3, 4, 5, 6, 7, 8, 9, A, B, C, D, E, F) so that together the two characters define up to 256 rows. Similarly, the two hexadecimal characters for the column address identifies up to 256 columns. Therefore, the hexadecimal row and column notation defines an array of up to $256^2$, that is, up to 65,536 dies on a wafer. The different encoding schemes employed may be applied to any of the data fields in a stage and/or across any one or more stages in one or more processing chains.

In the following tables, examples of data fields used in tag storage are given. The coding under the "Field Description" column is Extended ASCII except hexadecimal coding is employed where indicated by a subscript "h". The "No. Of Bits" column indicates the number of binary bits required for the Extended ASCII and hexadecimal coding as applicable.

TABLE 2

| Information | Field Description | No. Of Bits |
|---|---|---|
| Foundry | | |
| Supplier/Fab | Txx | 24 |
| Purchase Order Number | 200x0001 | 64 |
| Device No. | 4701xx | 48 |
| Lot No. | L2005xxx | 64 |
| Customer No. | Xxxxxx | 48 |
| Start Date/Hour/Minute | YYMMDDHHMM | 80 |
| Completion Date/Hour/Minute | YYMMDDHHMM | 80 |
| Wafer ID | L2005xxxww | 80 |
| Die ID | L2005xxxww[RrCc]$_h$ | 96 |
| Total | | 584 |
| Sort | | |
| Supplier/Factory | Axx | 24 |
| Work Order No | 200x00xxxx | 80 |
| Task name | Yy | 16 |
| Sub-lot No. | Zz | 16 |
| Start Date/Hour/Minute | YYMMDDHHMM | 80 |
| Completion Date/Hour/Minute | YYMMDDHHMM | 80 |
| Sort BIN number | Bb | 16 |
| Wafer Sort yield | Yy | 16 |
| Total | | 328 |
| Assembly | | |
| Supplier/Factory | Axx | 24 |
| Work Order No. | 200x00xxxx | 80 |
| Task | yy | 16 |
| Sublot No. | zz | 16 |
| Start Date/Hour/Minute | YYMMDDHHMM | 80 |
| Completion Date/Hour/Minute | YYMMDDHHMM | 80 |
| Total | | 296 |
| Final Test | | |
| Supplier/Factory | Axx | 24 |
| Work Order No. | 200x00xxxx | 80 |
| Task | yy | 16 |
| Sub-lot No. | zz | 16 |
| Bin No. | jj | 16 |
| Start Date/Hour/Minute | YYMMDDHHMM | 80 |
| Completion Date/Hour/Minute | YYMMDDHHMM | 80 |
| Re-do task | ii | 16 |
| Re-do Sub-lot No. | bb | 16 |
| Re-do Bin No. | ee | 16 |
| Re-do Start Date/Hour/Minute | YYMMDDHHMM | 80 |
| Re-do Completion Date/Hour/Minute | YYMMDDHHMM | 80 |
| Total | | 520 |
| Finished Goods | | |
| Final Device Top Mark | mmmmmmmm | 64 |
| Ship to Warehouse | wwww | 32 |
| Ship to Customer | cccccc | 48 |
| Ship date | YYMMDD | 48 |
| Carrier No. | nnnn | 32 |
| Total | | 224 |

The TABLE 2 information stored in the RF tag memory of a die, or any part thereof, may also be stored in the RF tag memory of a wafer. The above TABLE 2 data requires total 1,952 bits (approximately 2 kilo bits) and for a RF tag memory having a capacity of 128 kilo bits, 126 kilo bits remains available for other information for the die/device after the TABLE 2 data is stored. The remaining memory capacity may be used for any purpose, for example, storing test results, other process details, processing time, yield data, and important information in the downstream process chain.

Another form of representing and storing die location (its relative location on the wafer) in an RF tag, See TABLE 2—Die Location as follows:

TABLE 2

| Information | Field Description | No. Of Bits |
|---|---|---|
| Die Location | | |
| Die Width | xxxx | 32 |
| Die Height | yyyy | 32 |
| Die Row Number | [Rr]$_h$ | 8 |
| Die Column Number | [Cc]$_h$ | 8 |
| Wafer Size | vv | 16 |
| Total | | 96 |

In the TABLE 2—Die Location example, the physical location (that is, the X and Y coordinates) relative to an XY-axis coordinate system is known relative to an origin point 38 identified by a notch at the bottom of wafer 20 as explained in connection with FIG. 17. The physical location (that is, the X and Y coordinates) relative to the XY-axis coordinate system are determined according to industry standards based upon the wafer size (diameter), the die size (Die width and Die Height) and the X and Y address coordinates derived from the Die Row Number and the Die Column Number.

If the information to be stored is greater than the capacity of a single tag, then multiple tags can be employed as described in connection with FIG. 14 for a die and as described in connection with FIG. 17 for a wafer.

As an alternative to wafer tags, the die tags can be employed to store wafer information. In one particular embodiment, TABLE 2 for a die is expanded to include TABLE 2—Other as follows:

TABLE 2

| Information | Field Description | No. Of Bits |
|---|---|---|
| Other | | |
| Stage name | Xxx | 24 |
| Equipment name | Yyy | 24 |
| Recipe name | Rrrr | 32 |
| Check-in time | Tttt | 32 |
| Start time | Ssss | 32 |
| Completion time | Cccc | 32 |
| Results | Rrrr | 32 |
| Total | | 208 |

An example of the use of the memory fields of TABLE 2 is described in connection with the following TABLE 3 including TABLE 3—Identity, TABLE 3—Data and TABLE 3—Summary. The recording of data into the tag memory, like EEPROM memory 28, is done by executing a Store Data routine in the processor 42 for the sort stage, stage 21-1 of FIG. 8, for example. The processing equipment 52 in the local equipment 51 of the sort stage performs the tests for elements to which the tags 24 are attached. The data is temporarily accumulated in local memory 82 for stage computer 47, or alternatively is temporarily accumulated in the memory 69 of processor 42. From there, a Store Data routine of tag instructions are executed in the processor 42 to store the data into the tags 24. The Store Data routine is a program of WRITE Address and/or WRITE Selected instructions executed to store the data. Of course other routines such as a Time-Store routine are added to the program as appropriate or desired.

The TABLE 3 data is for recording the results of a CMOS die sort processing. TABLE 3—Identity indicates the identity information about the sort process.

TABLE 3

Identity
CHIP-MOS WAFER SORT REPORT

| | |
|---|---|
| PRODUCT TYPE: | 4007BQ1A1R |
| $1^{ST}$ SORT | * |
| $2^{ND}$ SORT | |
| PROGRAM NAME: | CWG4007L2 |
| PROBE CARD NO.: | Is4007AU-02 |
| LOT NO.: | L200523101 |
| SYSTEM: | 71T13 + TELP8 |
| INKER: | * |
| DATE: | Mar. 10, 2005 |
| SUMMARY: | |
| SITE NO: | 32 |
| TEMPERATURE: | 85 C. |

The TABLE 3—Data table has up to fifteen different tests ranging from BIN 1, BIN 2, . . . , BIN 15. In the particular example, BIN 3, BIN 4, BIN 5, BIN 7 BIN 10, BIN 11, BIN 12 and BIN 13 are not used and therefore are not included in the TABLE 3—Data table. In the TABLE 3—Data, BIN 01 stores the number of Good dies, BIN 02 stores the number of repairable dies, BIN 06 stores the number of dies that failed the ISB test (standby current test), BIN 08 stores the number of dies that failed the O/S test (Open Short test), BIN 09 stores the number of dies that failed the LKG test (Leakage test) and BIN 14 stores the number of dies that failed the G.F. test (Gross Functional Failure test). The rightmost column represents the yield (YLD) in percent for shippable dies for each wafer.

TABLE 3

Data

| Wafer ID | BIN 01 Good | BIN 02 Repair | BIN 06 ISB | BIN 08 O/S | BIN 09 LKG | BIN 14 G.F. | YLD % |
|---|---|---|---|---|---|---|---|
| N189588801 | 0 | 638 | 98 | 1 | 0 | 40 | 84.7 |
| N189588802 | 0 | 620 | 117 | 0 | 1 | 39 | 82.3 |
| N189588803 | 0 | 555 | 129 | 4 | 1 | 88 | 73.7 |
| N189588804 | 0 | 605 | 131 | 0 | 0 | 41 | 80.3 |
| N189588805 | 0 | 572 | 164 | 1 | 0 | 40 | 76.0 |
| N189588806 | 0 | 628 | 99 | 1 | 0 | 49 | 83.4 |
| N189588807 | 0 | 588 | 144 | 0 | 3 | 42 | 78.1 |
| N189588808 | 0 | 644 | 86 | 0 | 0 | 47 | 85.5 |
| N189588809 | 0 | 621 | 92 | 0 | 0 | 64 | 82.5 |
| N189588810 | 0 | 634 | 104 | 1 | 0 | 38 | 84.2 |
| N189588811 | 0 | 613 | 117 | 2 | 0 | 45 | 81.4 |
| N189588812 | 0 | 640 | 98 | 4 | 1 | 34 | 85.0 |
| N189588813 | 0 | 627 | 100 | 2 | 1 | 47 | 83.3 |
| N189588814 | 0 | 632 | 101 | 0 | 1 | 43 | 83.9 |
| N189588815 | 0 | 605 | 85 | 1 | 0 | 86 | 80.3 |
| N189588816 | 0 | 651 | 80 | 0 | 0 | 46 | 86.5 |
| N189588817 | 0 | 618 | 121 | 2 | 0 | 36 | 82.1 |
| N189588818 | 0 | 617 | 97 | 2 | 1 | 60 | 81.9 |
| N189588819 | 0 | 603 | 108 | 2 | 0 | 64 | 80.1 |
| N189588820 | 0 | 649 | 81 | 0 | 0 | 47 | 86.2 |
| N189588821 | 0 | 587 | 121 | 0 | 0 | 69 | 78.0 |
| N189588822 | 0 | 631 | 84 | 3 | 3 | 56 | 83.8 |
| N189588823 | 0 | 626 | 115 | 1 | 0 | 35 | 83.1 |
| N189588824 | 0 | 625 | 93 | 0 | 0 | 59 | 83.0 |
| N189588825 | 0 | 537 | 153 | 1 | 2 | 84 | 71.3 |
| | 0 | 15366 | 2718 | 28 | 14 | 1299 | |

Summary

| | |
|---|---|
| A'SSY Dice TOTAL | 15366 |
| A'SSY Dice NET | 15366 |
| TOTAL WAFER NUMBER | 25 |
| TOTAL REJECT WAFER NUMBER | 0 |
| NET-AVERAGE-GOOD per WAFER | 614 |
| AVERAGE-GOOD per WAFER | 614 |
| NET-YIELD | 81.6% |
| YIELD | 81.6% |

In FIG. 24, a visual display of tag data similar to the data of TABLE 3 is shown from a device indicating good (white) and bad (shaded) dies on a wafer where the bad dies are randomly located. The data of FIG. 24 differs from TABLE 3 in that the wafers of FIG. 24 have fewer dies. Also, FIG. 24 indicates that some dies were rejected whereas all the dies in TABLE 3 were repairable. The data used to form the visual display of FIG. 24 is accessed from the tags. The Retrieve Data routine is a program of READ Address and/or READ Selected instructions executed to read the data. Of course other routines such as a Time-Store routine are added to the program as appropriate or desired. The read data is temporarily stored in local memory 82 of stage computer 47 of FIG. 9, or alternatively is temporarily accumulated in the memory 69 of processor 42 of FIG. 9. From there, the data is output through a conventional application program to a display device or printer within the local equipment 51 of FIG. 9 or otherwise present in the system.

FIG. 25 depicts a visual display of a read out of tag data indicating good (white) and bad (shaded) dies on a wafer where the bad dies are as a result of the ISB (Standby Current) testing as shown in BIN 6. The failure dies in FIG. 25 are somewhat clustered together and tend to have a crescent shape pattern.

FIG. 26 depicts a visual display of a read out of tag data indicating good (white) and bad (shaded) die on a wafer where the bad die are as a result of the G. F. (Gross-functional failure) testing as shown in BIN 14. The failed dies in FIG. 26 tend to have a pattern different than the pattern that in FIG. 25.

FIG. 27 depicts a visual display of a read out of tag data indicating good (white) and bad (shaded) dies on a wafer where the bad dies are as a result of both the BIN 6 and BIN 14 defects of TABLE 3. The defects in FIG. 25 show that the BIN 6 and BIN 14 defects tend to have similar patterns that have some correlation to each other as a function of their die locations.

Referring to FIG. 8, the system 18 for tracking semiconductor example starts with wafers in one or more stages 21-1. The process stages 21-1 typically can be an ion implantation stage, a film deposition stage (e.g. depositing a polycrystalline silicon in a low-pressure chemical-vapor-deposition equipment), a photo-lithography stage, a particle inspection stage, an etch stage (e.g. Reactive-Ion-Etch), a critical dimension check stage and so forth. The process detail and other information cannot be stored in tags on the wafers since such tags are likely to be destroyed by the wafer processing. However, information can be stored in tag memory attached to the wafer carrier case as described in connection with FIG. 18. Such process information to be stored onto the wafer carrier RF tag is typically the equipment name, the check-in time of a check-in operation, the start-time of a start operation, the recipe used in the stage, the results collected (e.g. critical dimensions), and the completion-time of a completed operation. In the situation where the wafers are to be split into several subgroups (split lots), similar information is stored for each respective split lot (e.g. wafer identification information).

In FIG. 8, when tags are formed into or attached to dies and can be made operational, the tag information in the wafer carrier tag is loaded into the memory of the wafer tags and die tags. Preferably and in a preferred embodiment, the wafer carrier case tags, the wafer tags and the die tags all communicate with the same protocol through communicators 40 as described in connection with FIG. 9.

Communications between tags and communicators is accomplished by executing sequences of instructions (often called programs or routines) executed by the processor 42 in communicator 40 of FIG. 9. The routines are stored in the processor memory 69. Each routine is a step that is performed one or more times at any stage or any sequence of stages. One example for purposes of illustration is a Time-Store Routine for automatically recording time at each stage. The Time-Store Routine includes a sensing step, a time-capture step, and a record step. In the sensing step, a READ Selected instruction (see Table 1) is executed when, for example, a group of wafer tags are identified and selected by the stage communicator. In the time-capture step, the time is copied from the clock 68 of the processor 42 of FIG. 9. In the record step, the copied time is written to the selected tags using the WRITE Selected instruction (see Table 1) The Time-Store routine is applied to many operations such as check-in, start, and completion in each stage of the FIG. 8 chain. In some applications (e.g. in a supply-chain), the time stored on the tags contains minute, hour, date, month, and year information.

Another example of a routine, for purposes of illustration, is a Security routine. In some embodiments, tags operate with security algorithms that require, for example, a password for executing certain commands (such as KILL, LOCK, TALK etc.) called for by instructions in the Instruction Set in order to provide high security. Since the KILL command can permanently deactivate a tag such that the tag will no longer respond to or execute commands from communicators, password security protection is often employed.

One example of a Security routine for KILL instructions operates as follows: When a KILL Address instruction is to kill a tag at the Tag Address specified in the instruction; the instruction also provides a security string. The communicator sends the KILL command, the Tag Address and the security string to the tag. The tag receives the KILL command, the Tag Address and the security string and the controller 30 of FIG. 10 recognizes that a security check must be performed before executing the KILL command. The tag controller 30 first compares the received security string (typically comprising the Tag ID and a password) from the communicator with its own security string stored in the tag memory. The KILL command will be executed to kill the tag at the specified Tag Address if the security string supplied matches the security string stored. Since the KILL command can permanently deactivate a tag such that the tag will no longer respond to or execute commands from communicators, password security protection is employed. Security routines for other instructions can also be used as a step in any stage, when desired, to operate in an analogous manner.

A Test routine can be used as a step, when desired, to test the functionality and correct operation of tags. Typically, the Test routine is executed by the communicator to cause writing a data pattern into the tag memory followed by a reading of the data pattern with a comparison to validate that the data pattern was written and read correctly. In the Test routine, a series of WRITE Address instructions are issued each having a Tag Address and the write test data to be written. Each WRITE Address instruction is followed by a READ Address instruction and the read test data is compared with the write test data in processor 42 of FIG. 9. In the situation when the communicator identifies a failed tag because the read test data does not match the write test data as a result of the Test routine, the communicator can execute a KILL Address or KILL Selected instruction to permanently disable the failed tag or tags. There are situations when a failed tag cannot be killed by the communicator. When a tag has been killed or is otherwise not functional, an alternate tag on the same die can be identified as the operational tag and as the location for storing the results of the Test routines and other information.

A Report Status routine is used for controlling the number of responding tags to those of interest for any particular process or operation. The Report Status routine can be used as a step at any stage. The Final Test stage is used by way of example where a communicator is surrounded by thousands of packaged parts some that have been tested and some that are to be tested. In order to segregate those that have been tested from those that have not, the Report Status routine is used. If not otherwise established, a WRITE Address instruction is used to establish a location at a Tag Address used for status information and initializes the location to indicate an initial status (for example, not tested is "Status=0"). When a part is tested, the WRITE Address instruction is used to change the status field to indicate tested (tested is "Status=1"). At any time, a READ Filtered instruction is used to determine the Tag Addresses of tags that have a "Status=0" to find parts that remain to be tested. The Report Status routine in the example described avoids inadvertent testing of prior tested parts and thus avoids stressing parts unnecessarily.

An Inventory routine is used for determining tags that are within the range of a communicator. The Inventory routine can be used as a step at any stage and is used to detect newcomers to a stage. Any particular stage may have a communicator potentially surrounded by only a few elements or by thousands of elements. In order to determine the general population and an inventory of what is present, the Inventory routine is used. At any time, a READ Filtered instruction is used to determine the Tag Addresses of tags that have a predetermined condition. For example, a "Stage Inventory=0" field is established as a default value for tags that have not been inventoried and "Stage Inventory=1" value is stored for tags that have been inventoried. In operation, the Inventory routine is only looking for "Stage Inventory=0" values using the READ Filtered instruction. Normally, therefore, the number of tags responding will be readily within the bandwidth capabilities of the communication protocol. If too many tags have not been inventoried, then additional parameters (such as date and time) may be used to reduce the responding tags. For example, all tags having a date and time of one value (or range) will be selected. Next, a different date/time combination is processed until all relevant dates and times have been processed.

The accessing of information from the tag and other memories described, both content addressing and explicit addressing are possible. For example, when a READ Address or READ Selected instruction is employed, addressing is to locations explicitly identified by Tag Addresses provided in the instruction. However, when a READ Filtered instruction is employed, the addressing is based upon content.

The present invention operates in an environment where elements are processed in stages,—as shown in FIG. 1 and FIG. 2. Sequences of stages are grouped in chains as shown in FIG. 3 and chains are linked as sequences of chains as shown in FIG. 4 and FIG. 5. Elements are processed through stages, chains and sequences of chains from a beginning to an end. During processing from beginning to end, elements at any particular stage of any particular chain have a history of prior stages and prior chains and will have a history of subsequent stages and subsequent chains. Elements of one type at any one stage (for example dies) may result from elements of another type (for example, wafers) at prior stages where the element to element transition is from one element to plural elements. Similarly, elements of one type at any one stage (for example boards) may result from elements of another type (for example, dies in the form of packaged chips) at prior stages where the element to element transition is from plural elements to one element. The tracking of elements, information about the elements and the derivation of elements from prior elements progressing in the multistage environment is often complex.

In order to adequately track elements and information, a memory architecture is provided that permits each element to store, to the extent desired, the prior history of the element including prior stage processing and relationships to prior elements. Furthermore, when multiple elements from prior stages are grouped to form subsequent new elements of a different type, multiple prior tags from the multiple elements from prior stages are retained in the new elements and/or the new elements in turn may have new tags for receiving information from the prior tags and/or for storing new information. Regardless as to whether all tags for all elements are retained in subsequent elements, the information content for uniquely identifying all or any desired subset of the processing history is carried from stage to stage to the final element.

The present specification has focused upon a semiconductor processing example of multiple elements in multistage processing. In that example, wafers as described for example in connection with FIG. 17 were initial elements at stage 21-I of FIG. 8. At the end of wafer processing, a wafer tag, such as tag 25 in FIG. 17, is attached to wafer 20. The wafer tag 25 is processed to store the wafer processing history including, for example, the Batch ID, the Lot ID and the Wafer ID and processing information as described in connection with FIG. 17, FIG. 18 and FIG. 22.

In the next stage 21-1 of FIG. 8, die tags 24 for each die 22 on the wafer 20 of FIG. 17, are initialized and then updated with some or all of the wafer prior stage information, such as information or some part thereof in wafer tag 25. Inclusion of prior stage information in tags 24 is important since in subsequent processing stages, the dies 22 are cut from the wafer and hence the information in wafer tag 25 is not directly available. Processing information related to the stage 21-1 processing is added to the tags 24. The tags 24 are processed to store the wafer and die processing history including, for example, the Batch ID, the Lot ID and the Wafer ID and processing information as described in connection with FIG. 17, FIG. 18 and FIG. 22 and otherwise in this specification.

In the next stage 21-2 of FIG. 8, each die 22 including bound tags 24 are packaged, for example as described in connection with FIG. 19, FIG. 20 and FIG. 21. Optionally, a package tag $25_{21}$ is attached to package 90 as shown in FIG. 21. The tags 24 (identified as $24_1, \ldots 24_4$ in FIG. 19) optionally are available and/or package tag $25_{21}$ is available. In any of the possible cases, the Batch ID, the Lot ID and the Wafer ID and other prior processing information is available to be retained and available in tag memories bound to the packaged elements in stage 21-2 together with any added processing information from stage 21-2. For example, the package tag $25_{21}$ is processed to store the wafer and die processing history including, for example, the Batch ID, the Lot ID and the Wafer ID and processing information as described in connection with FIG. 17, FIG. 18 and FIG. 22 and otherwise in this specification.

In each subsequent processing stage of FIG. 8 through stages 21-P and 21-O additional processing information is added into the bound tags and/or into any added tags. Each of the finished goods from the stage 21-O of FIG. 8 have full history information, or any desired subset thereof, for the processing history-to-date of the elements.

The finished goods from output stages, such as the typical stage 21-O of FIG. 8, are represented as outputs from the chains $1_{11}$ and $1_{21}$ of FIG. 6. The subsequent chains $1_{12}$ and $1_{22}$ of FIG. 6 also attach tags and store element information into the new tags. For example, a board device processed in chain $1_{22}$ typically includes multiple packaged chip semiconductor devices from multiple prior chains of which chains $1_{11}$ and $1_{21}$ are typical. Each semiconductor device can include one or more tags, such as the tags 24 (identified as $24_1 \ldots 24_4$ in FIG. 19) and/or package tag $25_{21}$ (see FIG. 21) and collectively, these device tags are referred to as $T_{x1}$ tags and include tags $T_{11}$ and $T_{21}$ of FIG. 6. Similarly, a board device output from chain $1_{22}$ adds a board tag $T_{22}$ which is in addition to the plurality of $T_{x1}$ tags. Similarly, a board device output from chain $1_{12}$ adds a board tag $T_{12}$ which is in addition to the plurality of $T_{x1}$ tags. The board tags $T_{12}$ and $T_{22}$ include, if desired, an accumulation of all or some of the tag information from the device tags $T_{x1}$. Added processing information from the stages of chains $1_{12}$ and $1_{22}$ is typically added to the device tags $T_{x1}$ and/or to the board tags $T_{12}$ and $T_{22}$. All of such tags are of the type described in connection with FIG. 10, noting that in general, the board tags and tags other than the native die tags do not need ADD IN 61 and/or ROM CTRL 37 of FIG. 10.

The finished goods as boards from the outputs from the chains $1_{12}$ and $1_{22}$ of FIG. 6 are input to the system chain $1_{1x}$. The chain $1_{1x}$ again adds an element tag $T_{1x}$ and stores system element information where, in the FIG. 6 example, the system element is a computer. The system element includes the device $T_{x1}$ tags on packaged chips, includes the board tags $T_{12}$ and $T_{22}$ on board devices and includes the system tag $T_{1x}$ as provided by the system chain $1_{1x}$.

The addition of tags and the multistage processing as described results in a hierarchy of tags and information through multiple processing stages. The multiple tags in any stage may be accessed or inhibited from being accessed under security conditions and using protocols available at different communicators through out the various stages.

In one example, tags are locked by instructions at the final goods stage of any chain. When tags are locked, they are not readable without first being unlocked. Locked tags from a prior stage need to be unlocked before use at a subsequent stage and in order to be unlocked, proper authorization is required. Further, the tags from any stage may be KILLED for permanently preventing tag information from being accessed.

After LOCK, typically, the storage information in tag memory of a package, die or other tag is not readable by a communicator. In the situation where there is a need for accessing locked tags (such as when a malfunction occurs to the system and the system needs to be repaired) the tag information can be accessed only after unlocking all the necessary tags. Unlocking the tags typically requires security information (password, ID and other information). The tags are unlocked through executing a Security routine which requires presentation of a security password and other security information. Such security information is typically stored in tag memory. Where a hierarchy of tags are present (die tags, board tags, system tags) the hierarchy of passwords and security protocols can be distributed at each or any of the tag memory levels in the hierarchy and/or can be accumulated at the system level in the tag $T_{1x}$ of FIG. 6. In one embodiment, the system $T_{1x}$ tag memory functions like a repository of keys to access the tag information at any level and stores all passwords and protocols necessary (for example, Lot Number, Part Number and other information including passwords) in each die and each packaged part.

The Security routines used with tag stores are employed in a number of applications. One example previously described is to limit unwanted KILL or other actions and thereby provide safe operation avoiding inadvertent loss of information. Another example uses security to add a Validity Number at any stage of processing. The Validity Number is then used to validate the authenticity of a tag and the associated element.

Figure 28:
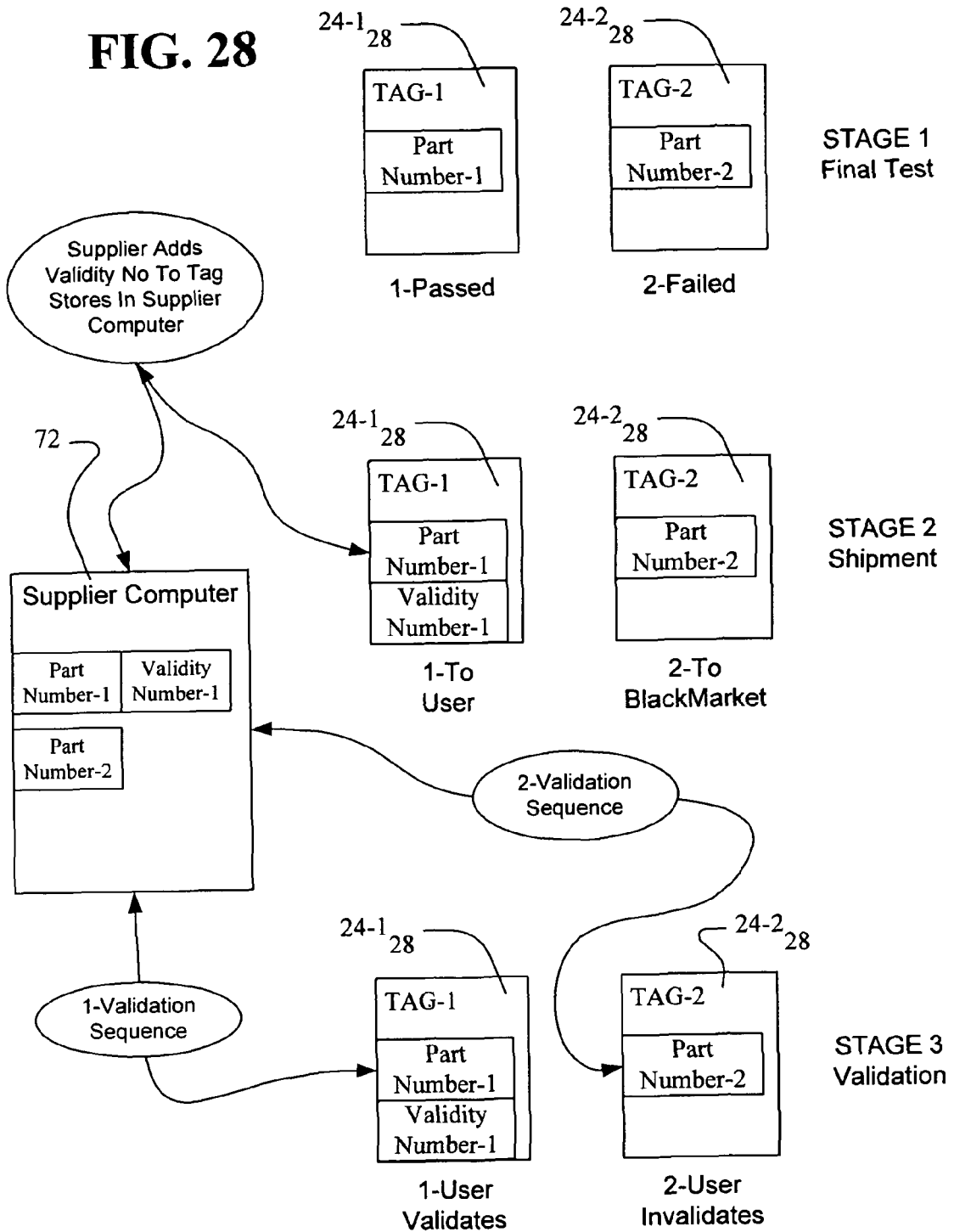
FIG. 28 depicts an example of validating the authenticity of elements by storing Validity Numbers in tag stores.

In FIG. 28, an example is shown for validating the authenticity of elements by storing Validity Numbers in tag stores. The TAG-1 24-1$_{28}$ and the TAG-2 24-2$_{28}$ are each attached to elements (not shown) that are typical of tags described in the present specification. STAGE 1 is assumed, for purposes of one example, as being a Final Test stage performed by a Supplier. For the example, the tag (TAG-1) 24-1$_{28}$ is assumed to pass the final test and the tag (TAG-2) 24-2$_{28}$ is assumed to fail the test. The Supplier after performing the Final Test then stores Validity Numbers into the tags where appropriate. For finished elements that pass the final test, a Validity Number is assigned and stored at a secure tag location (accessible only with password authentication) using a Security routine and a WRITE instruction. For finished elements that fail the final test, a Validity Number is not assigned (or is assigned with a value indicating the test failure) and the secure tag location is left empty or written with a failure indication. The Validity Number is generated in a typical example using the Part Number and an Encryption routine based upon the part number and known only by the Supplier and those authorized by the Supplier to know the Encryption routine. The Supplier also keeps a copy of the Validity Number in the Supplier computer 72 of FIG. 28 prior to shipment of the element having the passed tag 24-1$_{28}$ to a User. The User is, for example, a downstream manufacturer or reseller. The element with the failed tag 24-2$_{28}$ is not shipped by the Supplier. At times, failed goods or unauthorized copies of goods enter the black market and, for this reason and others, there is a need to be able to authenticate goods from a Supplier.

In FIG. 28, STAGE 2 the element with tag 24-1$_{28}$ is properly shipped to a User and in STAGE 3, the User wishes to validate tag 24-1$_{28}$. It is assumed that the User in STAGE 3 also has acquired an element with the unauthorized tag 24-2$_{28}$. One method of performing a validation sequence is performed on-line with a User, using a communicator 40 of the type described in FIG. 9, connected to the Supplier's computer such as management computer 41 in FIG. 8 and FIG. 9. With such connection established and with the tag 24-1$_{28}$ in the range of the communicator 40 of FIG. 9, the Validation routine is carried out as follows. The User's communicator 40 sends a request to the Supplier's computer 41 for validation of certain elements purportedly from the Supplier. The request can be manually or automatically initiated. Automatic initiation occurs, for example, when elements are first introduced into the inventory of the User which is detected, for example, after the Inventory routine is executed and new elements are found. The processor 42 sends the part numbers for the new elements to the Supplier's computer 41. The Supplier's computer then issues a READ instruction and reads the Validation Number for the tag 24-1$_{28}$. The Validation Number read from the tag 24-1$_{28}$ is communicated by the processor 42 to the management computer 41. The management computer 41 then decodes the Validity Number using the Part Number (and any other desired information available) to determine if the Validity Number is the correct one for the tag 24-1$_{28}$. If correct, the valid status together with time and date information is stored into the tag 24-1$_{28}$ and otherwise communicated to the User. In the case of the tag 24-2$_{28}$ the same Validation routine is repeated, but is this case, no valid Validity Number is detected and hence the invalid status together with time and date information is stored into the tag 24-1$_{28}$ and otherwise communicated to the User. Typically, the storage location for the Validity Number and access thereto is password protected so that only the Supplier has access to the Validity Number. If the Supplier wishes, the Supplier can share the password and/or the Validity Number encoding or decoding algorithm with the User or others under terms and conditions deemed suitable by the Supplier.

While use of Security routines and Validity Numbers has been described in connection with semiconductor elements and finished goods made therefrom, the routines are applicable to many fields. For example, the pharmaceutical field employs tag Security routines in the same manner as the semiconductor element example. Additionally, the pharmaceutical Supplier might wish to track the transit of goods distinguishing those that have only shipped within the domestic United States from those that have shipped outside the United States to another country, such as Canada, and then shipped back into the United States.

As another example, many consumer items such as famous watches, expensive apparel, jewelry and electronic equipment are the subject of counterfeiting. Communicators made available to US customs or other authority together with Security routines provided by Suppliers are effective to thwart and identify counter goods.

As a still further example, terrorism involving contamination of goods can be better detected by requiring all goods in transit to have tags that are analyzed as to Security routines, Validity Numbers as well as transit locations for the entire history of the goods.

The use of a Validity Number can have many applications to thwart unauthorized use of finished elements with tags attached thereto. Any subsequent User of an element (such as a downstream manufacturer, board integrator, system integrator, distributor, reseller, seller or other) wishing to guarantee the authenticity of the element contacts the Supplier and after proper identification of the User, the finished element part number and any other information desired by the Supplier, the Supplier then authenticates the goods. Typically, if the User fails to authenticate finished elements from the Supplier, the Supplier's warranty or other obligations are voided. The authentication procedure is particularly useful in thwarting black market, counterfeit or other unauthorized transactions in unauthorized goods.

Figure 29:
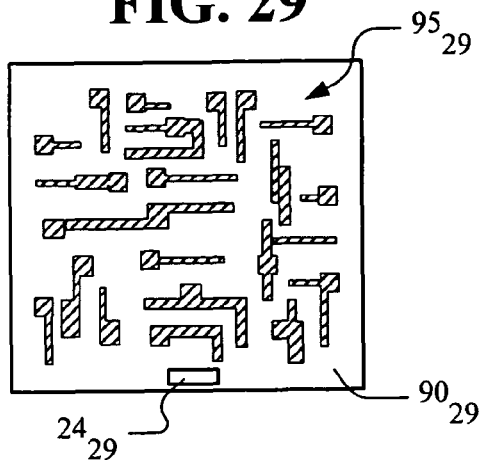
FIG. 29 depicts one typical mask used in semiconductor manufacturing processes.

In FIG. 29, a typical mask 90$_{29}$ has a typical mask pattern 95$_{29}$ for use in manufacturing semiconductor products in semiconductor manufacturing processes. The mask pattern 95$_{29}$ is usually on a glass or other transparent substrate so that optical, X-ray or other energy sources can be imaged through the mask onto a prepared wafer surface. Typically, a set of up to thirty-eight different masks are sequentially used in sequential steps of the semiconductor manufacturing processes to expose a wafer to form one die. The mask 90$_{29}$ represents one mask of the set of masks used in one step for one die. In some examples, the mask 90$_{29}$ can represent one mask of the set of masks for several dies (e.g. 4 dies) depending on the hardware limitation of the energy source and the die size. Using one die represented by one mask as an example, the mask pattern $95_{29}$ for one die area is repeated in an exposure step for each die to be created on a wafer. If the wafer is to have 200 dies, then the mask pattern $95_{29}$ for one step is stepped to one die area, exposed at that die area and then stepped to the next die area for the next exposure step. The stepping and exposing process is repeated for each die to be exposed so that in the case of the 200 die example, the mask is stepped 200 times for the wafer. When the first mask of a set has exposed all die areas (200 in the example described) and layer processing is completed, a photo-lithography step is typically performed to generate patterns of similar shape on the wafer. The photo-lithography step is typically followed by other semiconductor processing steps (for example, an ion implantation step). The next mask in the set is then used and stepped to expose all the die areas for the second mask. The processing continues until the wafer has been exposed with all masks in the set. The mask $95_{29}$ includes a tag $24_{29}$ like the other tags described in this specification, for example, like the wafer tags 25 of FIG. 22.

Figure 30:
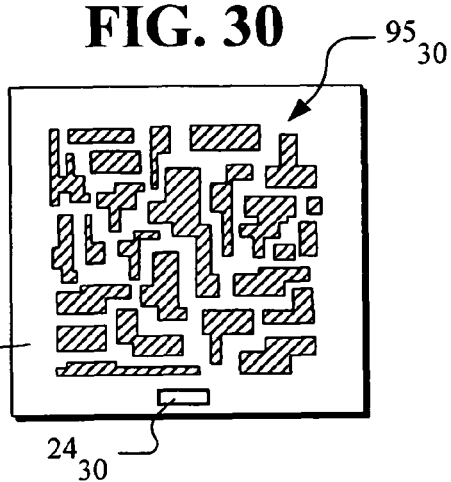
FIG. 30 depicts another typical mask used in semiconductor manufacturing processes.

In FIG. 30, another typical mask $90_{30}$ has a typical mask pattern $95_{30}$ for use in manufacturing semiconductor products in semiconductor manufacturing processes. The mask $90_{30}$ represents one mask of the set of masks for one die. The mask pattern $95_{30}$ is used with the mask $90_{29}$ of FIG. 29 as part of the same set of masks (see FIG. 32). The mask pattern $95_{30}$ for one die area is repeated for each die to be created on a wafer. The mask $95_{30}$ includes a tag $24_{30}$ like the other tags described in this specification, for example, like the wafer tags 25 of FIG. 22.

In semiconductor product manufacturing, it is common to have more than one manufacturer and more than one Fab qualified to manufacture the same product. In such cases, a product (such as a packaged semiconductor device) will be identified by a Manufacturer ID, a Fab ID as well as a Part ID. While the functional characteristics of products with the same Part ID (Part Number) are substantially the same, the Manufacturer ID, Fab ID, manufacturing history, and many other parameters often vary significantly. Also, even for the same manufacturer, revisions on the circuit design of a product and variations on a family of products often occur over time and hence the history and identity of products and elements along the processing chain is important.

Figure 31:
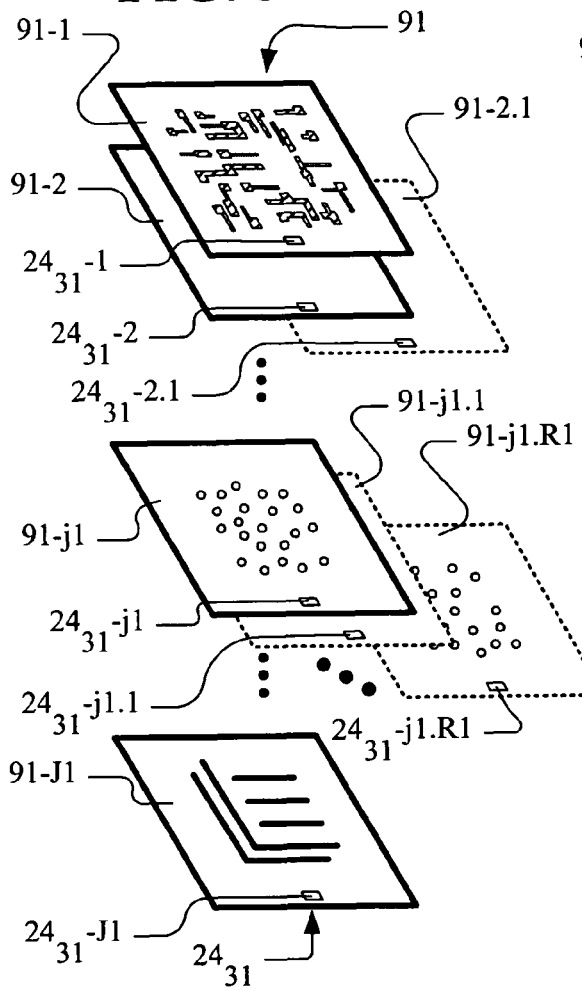
FIG. 31 depicts an example of a set of semiconductor masks, each mask having a tag for storing the hierarchy of mask relationships for one semiconductor part.

In FIG. 31, an example of a set of semiconductor masks 91 similar to the mask $90_{29}$ of FIG. 29 and mask $90_{30}$ of FIG. 30 is shown. The masks 91 include the first level masks 91-1, 91-2, . . . , 91-j1, . . . , 91-J1. Each of the masks 91 has a corresponding tag $24_{31}$ for storing the hierarchical mask identity and relationships for one or more semiconductor parts. In particular, the masks 91-1, 91-2, . . . , 91-j1, . . . , 91-J1 have the corresponding tags $24_{31}$-1, $24_{31}$-2, . . . , $24_{31}$-j1, . . . , $24_{31}$-J1, respectively.

In FIG. 31, the first level masks 91-1, 91-2, . . . , 91-j1, . . . , 91-J1 are frequently revised from time to time in terms of the mask design or in terms of other features and parameters particular to a mask. For example, the particular processing conditions employed in the use of a mask may change as well as the mask design itself (due to circuit design changes). In one example in FIG. 31, the first level mask 91-2 having tag $24_{31}$-2 undergoes a first revision and a new revised mask 91-2.1 is formed with a tag $24_{31}$-2.1. Similarly, any particular one of the masks 1, 2, . . . , J1 in the set of masks $24_{31}$ can undergo multiple levels of revisions. For example, the first level mask 91-j1 undergoes multiple levels of revision to form the revised masks 91-j1.1, . . . , 91-j1.R1 having corresponding tags $24_{31}$-j1.1, . . . , $24_{31}$-j1.R1, respectively.

The example of FIG. 31 demonstrates that the hierarchy of information for semiconductor processing using masks is complex. In FIG. 31, there is a set of J1 masks (where J1 is an integer up to approximately 38), each of the J1 masks can undergo R1 revisions (where R1 is assumed to be less than 100) and the data reflecting circuit design changes and variations for a mask can be very large. The hierarchy of information for mask processing is of the form where masks are identified with an address (some times called an identity indicator) allocated with N-Field addresses, or subsets thereof, including the address fields A1, A2, . . . , AN. Similarly, information about the masks and the processes in which they are used is represented by the M-Field data fields D1, D2, . . . , DM.

The mask tags 91 of FIG. 31 as part of the identity information frequently store the manufacturer information of the mask, the processing history including, for example, the Lot ID of the mask within the address fields A1, A2, . . . , AN. Additionally, a Mask ID is stored as part of the hierarchy address fields A1, A2, . . . , AN. The Mask ID includes, for example, the mask grade, the Manufacturer ID, the Fab ID, the Part ID, the Mask Set ID, the Mask Sequence, the Mask Number (or Mask Code) in the mask set, the Digitized Pattern of a design (e.g. metal-1 design), the Mask Type (e.g. stepper or scanner), the Phase-Shift-Mask type, the Mask Revision. In some examples, additional features such as Optical Proximity Correction are added on mask patterns for improving manufacturing control on semiconductor products. The associated identification of Optical Proximity Correction (OPC ID) can be also stored as a part of the hierarchy address fields. The hierarchy address fields A1, A2, . . . , AN described are by way of a particular example and of course can be expanded and modified to meet the needs of any processing chain. Similarly, the data fields D1, D2, . . . , DM can be expanded and modified to meet the needs of any processing chain.

Figure 32:
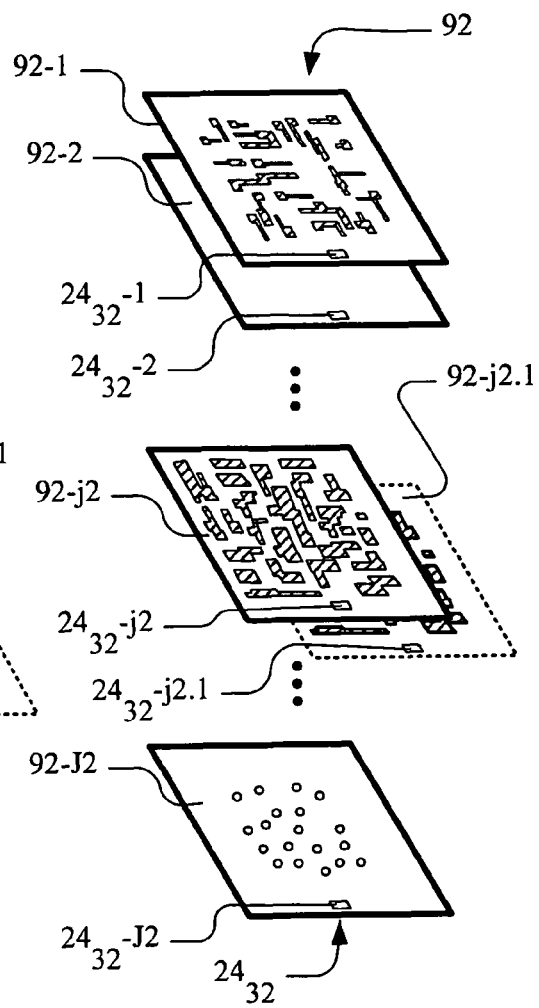
FIG. 32 depicts another example of a set of semiconductor masks, each mask having a tag for storing the hierarchy of mask relationships for one semiconductor part.

In FIG. 32, an example of a set of semiconductor masks 92 similar to the mask 91 of FIG. 31 is shown. The masks 92 include the first level masks 92-1, 92-2, . . . , 92-j2, . . . , 92-J2. Each of the masks 92 has a corresponding tag $24_{32}$ for storing the hierarchical mask identity and relationships for one or more semiconductor parts. In particular, the masks 92-1, 92-2, . . . , 92-j2, . . . , 92-J2 have the corresponding tags $24_{32}$-1, $24_{32}$-2, . . . , $24_{32}$-j2, . . . , $24_{32}$-J2, respectively. In FIG. 32, the mask 92-j2 is the mask $90_{29}$ of FIG. 29 and in FIG. 32 has one revision level indicated by mask 92-j2.1 and corresponding tag $24_{32}$-j2.1.

In FIG. 32, it has been assumed that the masks 92 for one manufacturer are for the same Part ID as for the masks 91 in FIG. 31 for a different manufacturer. The hierarchy address fields A1, A2, . . . , AN stored in the tags $24_{31}$ and $24_{32}$ will among other differences have different Manufacturer IDs as well as different Mask IDs.

The tags $24_{29}$, $24_{30}$, $24_{31}$ and $24_{32}$ of FIG. 29, FIG. 30, FIG. 31 and FIG. 32 are RF tags and hence are particularly useful in processing stages for identifying and selecting masks without need for human touching and viewing of the Mask ID. The mask tags are accessed using RF communicators of the type described in connection with FIG. 9.

While the invention has been particularly shown and described with reference to preferred embodiments thereof it will be understood by those skilled in the art that various changes in form and details may be made therein without departing from the scope of the invention.

The invention claimed is:

1. A method of tracking one or more of a plurality of semiconductor elements being processed through a plurality of semiconductor element processing stages, comprising the steps of:

permanently fixing at least one tag to each of the plurality of semiconductor elements at an initial semiconductor element processing stage, each tag for storing information in a tag memory and for providing wireless communication with a communicator, wherein the tag memory uses a hierarchical memory configuration for storing identity and/or processing history tracking information of the associated semiconductor element for each of the plurality of semiconductor element processing stages; and at each semiconductor element processing stage after the fixing of the tags, electronically storing the identity and/or processing history tracking information associated with each or all of the plurality of semiconductor elements at that semiconductor element processing stage into the tag memory of the tags using the hierarchical memory configuration.

2. The method of claim 1, wherein the plurality of semiconductor elements comprise any one of wafers, dies, packaged devices, semiconductor masks, and/or wafer carriers.

3. The method of claim 1, wherein the initial semiconductor element processing stage comprises one of an initial wafer processing stage or an initial integrated circuit packaging stage or an initial component processing stage.

4. The method of claim 1, wherein the semiconductor element processing stages comprise one or more of manufacturing, unfinished goods distribution, warehousing, finished goods distribution, multi-chip package manufacturing, multi-chip package distribution, designed-in subsystems, produced-in subsystems, warehoused-in subsystems and/or distributed-in subsystems.

5. The method of claim 1, wherein permanently fixing at least one tag to each of the plurality of semiconductor elements comprises manufacturing the tags using the native processing steps of the semiconductor element processing stages or attaching the tag to the semiconductor elements during the initial semiconductor element processing stage.

6. The method of claim 1, wherein electronically storing the identity and/or processing history tracking information associated with each or all of the plurality of semiconductor elements at that semiconductor element processing stage into the tag memory of the tags using the hierarchical memory configuration comprises:

storing by wireless communication the identity and/or processing history tracking information associated with each or all of the plurality of semiconductor elements at that semiconductor element processing stage into the tag memory of the tags using the hierarchical memory configuration.

7. The method of claim 1, wherein the hierarchical memory configuration comprises a memory configuration using N address fields, each address field being associated with identity and/or processing history tracking information of the semiconductor element affixed with the tag at a respective one of the plurality of semiconductor element processing stages.

8. The method of claim 1, wherein the identity information for each tag comprises a Tag ID and address for uniquely identifying the tag and for uniquely identifying a respective semiconductor element to which the tag is affixed.

9. The method of claim 1, wherein the plurality of semiconductor elements comprises semiconductor dies where each die has a Die ID, where each die is from a wafer having a Wafer ID, where the wafer is from a lot of wafers having a Lot ID, where the lot is from a batch of wafers having a Batch ID and wherein the identity information comprises one or more IDs from the group including the Die ID, the Wafer ID, the Lot ID and the Batch ID for uniquely identifying the tag and for uniquely identifying a respective semiconductor element to which the tag is affixed.

10. The method of claim 1, further comprising:

at each of the plurality of semiconductor element processing stages, accessing the information stored in the tag memory of the tags using the hierarchical memory configuration.

11. The method of claim 10, wherein accessing the information stored in the tag memory of the tags using the hierarchical memory configuration comprises accessing using wireless communication the information stored in the tag memory of the tags using the hierarchical memory configuration.

12. The method of claim 10, wherein accessing the information stored in the tag memory of the tags using the hierarchical memory configuration comprises:

providing a command from an instruction to the one or more tags; and executing the command to access the information stored in the tag memory of the tags.

13. The method of claim 10, wherein accessing the information stored in the tag memory of the tags using the hierarchical memory configuration comprises:

executing tag program routines formed of instructions from a tag instruction set where the instructions issue commands that write to, read from and otherwise access the tags.

14. The method of claim 13, wherein one of the tag program routines comprises a security routine employing a password.

15. The method of claim 13, wherein one of the tag program routines comprises a time-store routine for loading time/date information into the tags.

16. The method of claim 13, wherein one of the tag program routines comprises a security routine for controlling access to the tags.

17. The method of claim 13, wherein one of the tag program routines comprises an inventory routine for detecting the presence of tags.

18. The method of claim 13, wherein one of the tag program routines comprises an initialization routine for loading Tag IDs into the tags.

19. The method of claim 13, wherein one of the tag program routines comprises a test routine for testing the functionality of tags.

20. The method of claim 13, wherein one of the tag program routines comprises a data store routine for storing data into the tags.

21. The method of claim 13, wherein one of the tag program routines comprises a report status routine for reporting the status of the tags.

22. The method of claim 13, wherein one of the tag program routines comprises an encryption routine for storing encrypted validity numbers into the tags.

23. The method of claim 22, wherein one of the tag program routines comprises a validation routine for validating the encrypted validity numbers stored in the tags.

24. The method of claim 1, wherein the plurality of semiconductor elements comprises semiconductor dies having corners and permanently fixing at least one tag to each of the plurality of semiconductor elements comprises permanently fixing a tag to one or more corners of the semiconductor dies.

25. The method of claim 1, wherein the plurality of semiconductor elements comprises semiconductor dies and permanently fixing at least one tag to each of the plurality of semiconductor elements comprises permanently fixing two or more tags to each of the semiconductor dies, the tag memory of the two or more tags of each semiconductor die storing identify information for uniquely distinguishing the addressing for the two or more tags on the semiconductor die.

26. The method of claim 1, wherein electronically storing the identity and/or processing history tracking information into the tag memory of the tags comprises logically enabling the tags with a logical gate.

27. The method of claim 26, wherein the plurality of semiconductor elements comprises semiconductor dies having die pads for connection to circuits on the dies and the logical gate receives a logical input from one or more die pads during testing of the die to enable the tag.

28. The method of claim 26, wherein the plurality of semiconductor elements comprises semiconductor dies having conductive layers and the logical gates of the tags receive logical inputs from the conductive layers.

29. A system for processing one or more of a plurality of hierarchical elements at a plurality of processing steps, where the hierarchical elements are subjected to common processing at each of the processing steps, the system comprising:
 one or more tags affixed to each of the plurality of hierarchical elements, each tag comprising a tag memory for storing information, a tag I/O unit for providing wireless communication, and a tag controller for accessing the tag memory to read and write information from and into the tag memory, wherein the tag memory uses a hierarchical memory configuration for storing identity and/or processing history tracking information of the associated hierarchical element for each of the plurality of processing stages; and
 a management system comprising a management memory, a control unit and an I/O unit, the management system communicating with the one or more tags using wireless links to retrieve identity and/or processing history tracking information stored in the tag memory of the tags and the management system storing the retrieved identity and/or processing history tracking information in the management memory.

30. The system of claim 29, wherein the hierarchical memory configuration comprises a memory configuration using N address fields, each address field being associated with identity and/or processing history tracking information of the hierarchical element affixed with the tag at a respective one of the plurality of processing stages.

31. The system of claim 29, wherein the management system stores the retrieved identity and/or processing history tracking information in the management memory to provide real-time location visibility and process history reporting information for the one or more hierarchical elements affixed with the tags.

32. The system of claim 29, wherein the plurality of hierarchical elements comprise any one of wafers, dies, packaged devices, semiconductor masks, and/or wafer carriers.

33. The system of claim 29, wherein the tag memory of each of the tags comprises a read only memory (ROM) for storing identity information for the tag and an electrical erasable programmable random access memory (EEPROM).

34. The system of claim 33, wherein each of the tags comprises a ROM control for initializing the read only memory.

35. The system of claim 29, wherein each of the tags comprises an add-in unit for providing low-order databits for uniquely identifying one of a plurality of tags associated with a particular hierarchical element.

36. The system of claim 29, wherein the hierarchical elements are of different types wherein a first element of one type at one stage is associated with a plurality of second elements of another type at another stage and wherein the first element includes a first tag and wherein the second elements include a plurality of second tags, each of the second tags including second tag memories wherein the second tag memories store hierarchical information associated with the first element and hierarchical information associated with the second elements.

37. The system of claim 29, wherein the tag memory of each of the tags is content addressable.

38. A tag transportable with a semiconductor element being processed at a plurality of semiconductor element processing stages comprising:
 a tag memory having storage locations for storing information for the associated semiconductor element at each of the plurality of semiconductor element processing stages, wherein the tag memory uses a hierarchical memory configuration for storing identity and/or processing history tracking information of the associated semiconductor element for each of the plurality of semiconductor element processing stages;
 a controller for accessing the tag memory to read and write identity and/or process history tracking information using the hierarchical memory configuration at the plurality of semiconductor element processing stages; and
 an I/O unit for providing communication with the tag memory at the plurality of semiconductor element processing stages, the tag memory being accessed using the hierarchical memory configuration.

39. The tag of claim 38, wherein the hierarchical memory configuration comprises a memory configuration using N address fields, each address field being associated with identity and/or processing history tracking information of the semiconductor element affixed with the tag at a respective one of the plurality of semiconductor element processing stages.

40. The tag of claim 38, wherein the plurality of semiconductor elements comprise any one of wafers, dies, packaged devices, semiconductor masks, and/or wafer carriers.

41. The tag of claim 38, wherein the semiconductor element is formed by native processing and the tag memory, the controller and the I/O unit are formed using the native processing.

42. The tag of claim 38, wherein the semiconductor element is formed by native processing and the tag memory, the controller and the I/O unit are formed separate from the semiconductor element and the tag is attached to the semiconductor element during an initial stage in the native processing.

43. The tag of claim 38, wherein the identity information for each tag comprises a Tag ID and address for uniquely identifying the tag and for uniquely identifying a respective semiconductor element to which the tag is affixed.

44. The tag of claim 38, wherein the semiconductor element comprises a semiconductor die having a Die ID, where the die is from a wafer having a Wafer ID, where the wafer is from a lot of wafers having a Lot ID, where the lot is from a batch of wafers having a Batch ID and wherein the identity information comprises one or more IDs from the group including the Die ID, the Wafer ID, the Lot ID and the Batch ID for uniquely identifying the tag and for uniquely identifying a respective semiconductor element to which the tag is affixed.

45. A system comprising:
 a management computer comprising a management memory, a control unit and an I/O unit, the management computer using wireless links to communicate with one or more tags, each tag having a tag memory, a tag controller and a tag I/O unit, wherein the management computer communicates with the one or more tags to retrieve identity and/or process history tracking information stored in the tag memory of the one or more tags, the identity and/or process history tracking information being associated with each of a plurality of processing stages of one or more semiconductor elements affixed with the one or more tags, and wherein the management computer stores in the management memory the retrieved identity and/or process history tracking information to provide real-time location visibility and process history reporting information for the one or more semiconductor elements affixed with the tags.

* * * * *